United States Patent
Affolter et al.

(10) Patent No.: US 6,190,181 B1
(45) Date of Patent: Feb. 20, 2001

(54) CONNECTION BASE

(75) Inventors: Hugo Affolter, Lengnau; Christoph Haffter, Carrouge, both of (CH)

(73) Assignee: E-tec AG, Lengnau (CH)

(*) Notice: Under 35 U.S.C. 154(b), the term of this patent shall be extended for 0 days.

(21) Appl. No.: 09/180,472

(22) PCT Filed: May 12, 1997

(86) PCT No.: PCT/CH97/00184

§ 371 Date: Nov. 10, 1998

§ 102(e) Date: Nov. 10, 1998

(87) PCT Pub. No.: WO97/43885

PCT Pub. Date: Nov. 20, 1997

(30) Foreign Application Priority Data

May 10, 1996 (CH) .................................................. 1202/96
Jan. 15, 1997 (CH) ....................................................... 73/97

(51) Int. Cl.⁷ ............................. H01R 12/00; H05K 1/00

(52) U.S. Cl. .............................................. 439/70; 439/71

(58) Field of Search ................................. 439/70, 71, 66, 439/74, 73

(56) References Cited

U.S. PATENT DOCUMENTS

| 4,508,405 | 4/1985 | Damon et al. . |
| 4,620,761 | 11/1986 | Smith et al. . |
| 4,642,889 | 2/1987 | Grabbe . |

(List continued on next page.)

FOREIGN PATENT DOCUMENTS

| 27 15 056 | 10/1978 | (DE) . |
| 3832410 | 4/1989 | (DE) . |
| 105 628 | 4/1984 | (EP) . |
| 360 485 A3 | 3/1990 | (EP) . |
| 2214179 | 8/1974 | (FR) . |
| 2635616 | 2/1990 | (FR) . |
| 1493554 | 11/1977 | (GB) . |

OTHER PUBLICATIONS

Patent Abstracts of Japan, vol. 13, No. 338 (E–795) Jul. 1989 re JP,A,01 097382.
"Ball Grid Array SMD Production Socket", E–tec The Swiss Connection, Aug. 1998, 11 pages.
Mace, et al., "Customable Multi–Contact–Point Interposer", IBM Technical Disclosure Bulletin, vol. 37, No. 04B, Apr. 1994, pp. 105–106.
Neuman, et al., "Electrically Conductive Array in an Elastomeric Material", IBM Technical Disclosure Bulletin, vol. 25, No. 4, Sep. 1982, pp. 1801–1802.
Patent Abstracts of Japan, vol. 096, No. 012, Dec. 1996, re JP 08 203644.

Primary Examiner—Lincoln Donovan
Assistant Examiner—Kyung S. Lee
(74) Attorney, Agent, or Firm—Pillsbury Madison & Sutro LLP

(57) ABSTRACT

Detachable attachment base for a BGA (Ball Grid Array), CGA (Column Grid Array), LGA (Land Grid Array), or flip-chip type integrated circuit and comprising a support (7) traversed by openings (13). A metal pin (3) is inserted in each of the openings (13). One end of each pin is intended to be placed in electrical contact with at least one path (8) of the printed circuit, while the other end is intended to be placed in electrical contact with a connection finger (6) of the electric component mounted (1) or of the other printed circuit.

Figure 1:
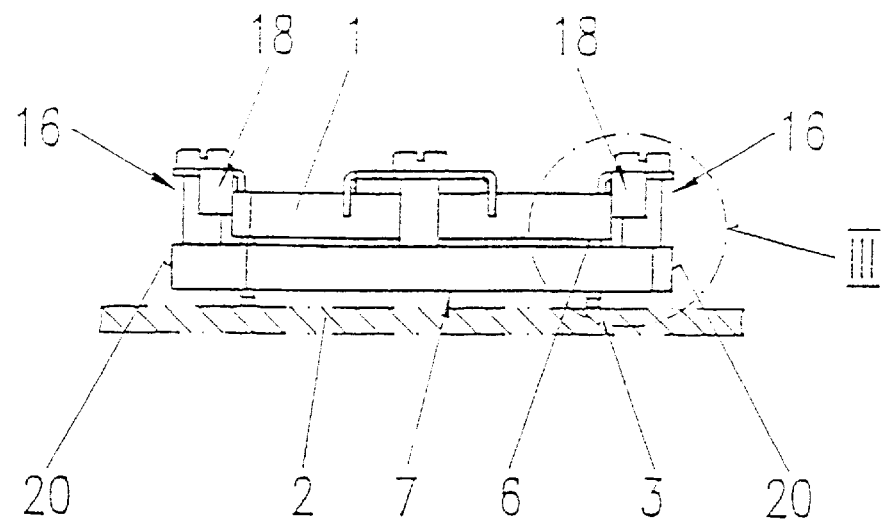

The pins are held longitudinally only loosely within the openings (13), between two springs (4 and 40) permitting the pins to move slightly.

The pins may be composed of a rod (3) or of a spring (3'). The springs (4 and 40) may be replaced by a rubber mat containing parallel electric wires. A radiator (35) holds the integrated circuit on the base.

40 Claims, 15 Drawing Sheets

U.S. PATENT DOCUMENTS

| | | |
|---|---|---|
| 4,729,166 | 3/1988 | Lee et al. . |
| 4,904,213 | 2/1990 | Hock et al. . |
| 4,922,376 | 5/1990 | Pommer et al. . |
| 5,076,794 * | 12/1991 | Ganthier ................................ 439/70 |
| 5,321,583 | 6/1994 | McMahon . |
| 5,366,380 * | 11/1994 | Reymond ............................... 439/66 |
| 5,376,010 | 12/1994 | Petersen . |
| 5,431,571 | 7/1995 | Hanrahan et al. . |
| 5,500,605 | 3/1996 | Chang . |
| 5,518,410 | 5/1996 | Masami . |
| 5,561,594 | 10/1996 | Wakefield . |
| 5,611,696 | 3/1997 | Donner et al. . |
| 5,702,255 * | 12/1997 | Murphy et al. ........................ 439/71 |
| 5,727,954 * | 3/1998 | Kato et al. ............................. 439/66 |
| 5,730,620 | 3/1998 | Chan et al. . |
| 5,766,021 | 6/1998 | Pickles et al. . |
| 5,805,419 * | 9/1998 | Hundt et al. ......................... 361/719 |

* cited by examiner

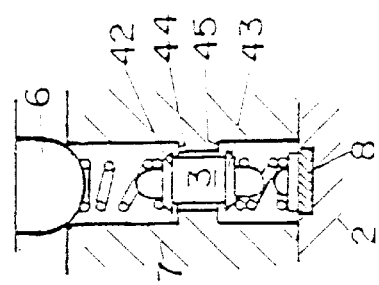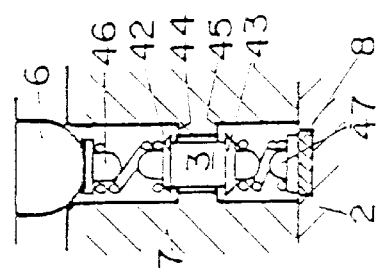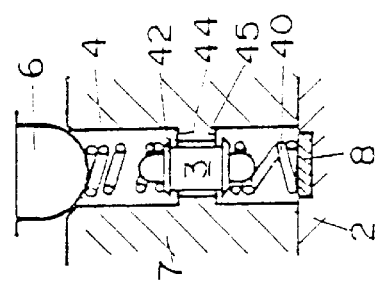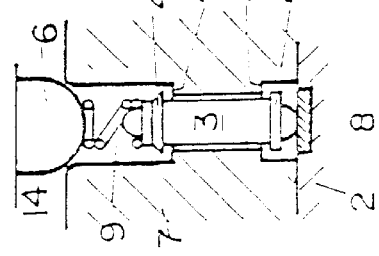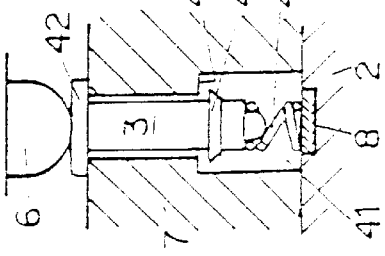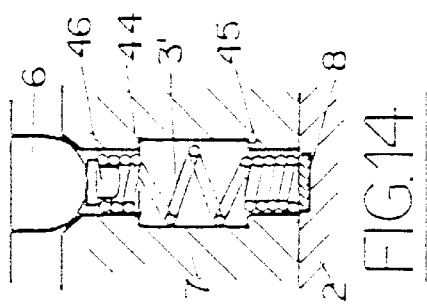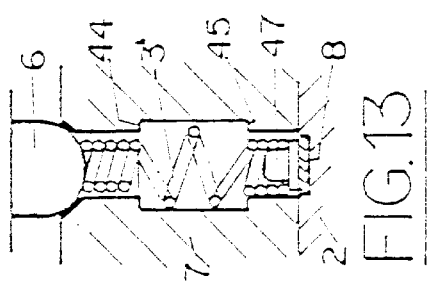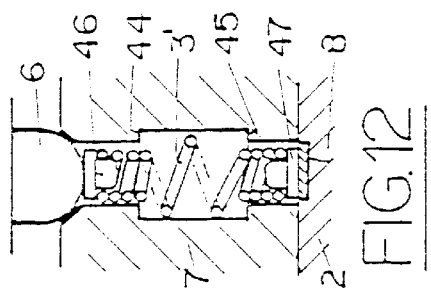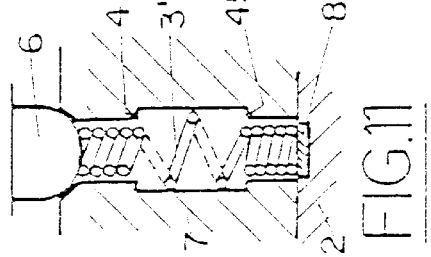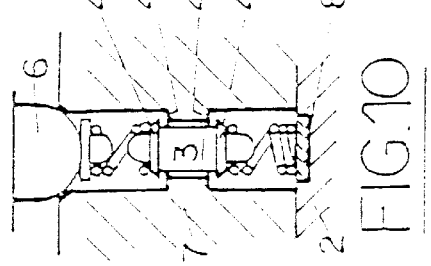

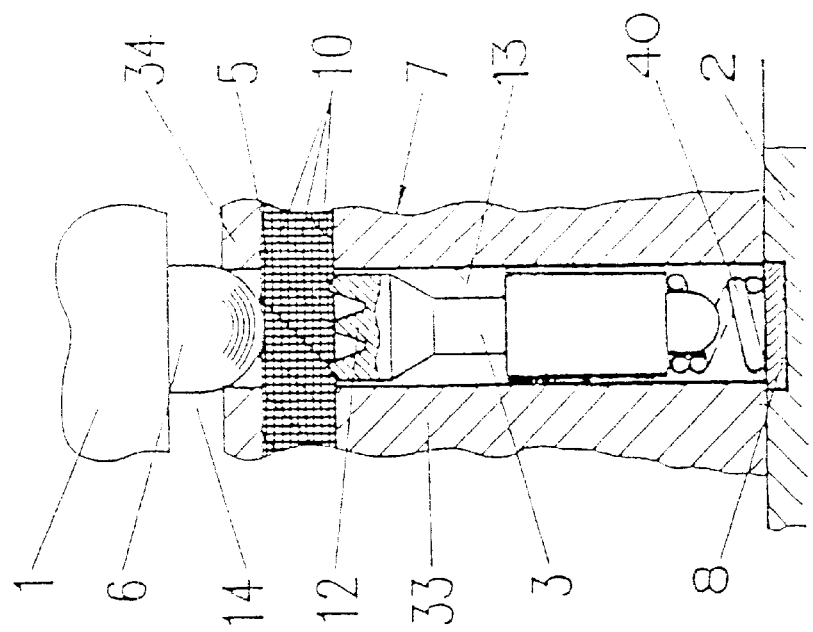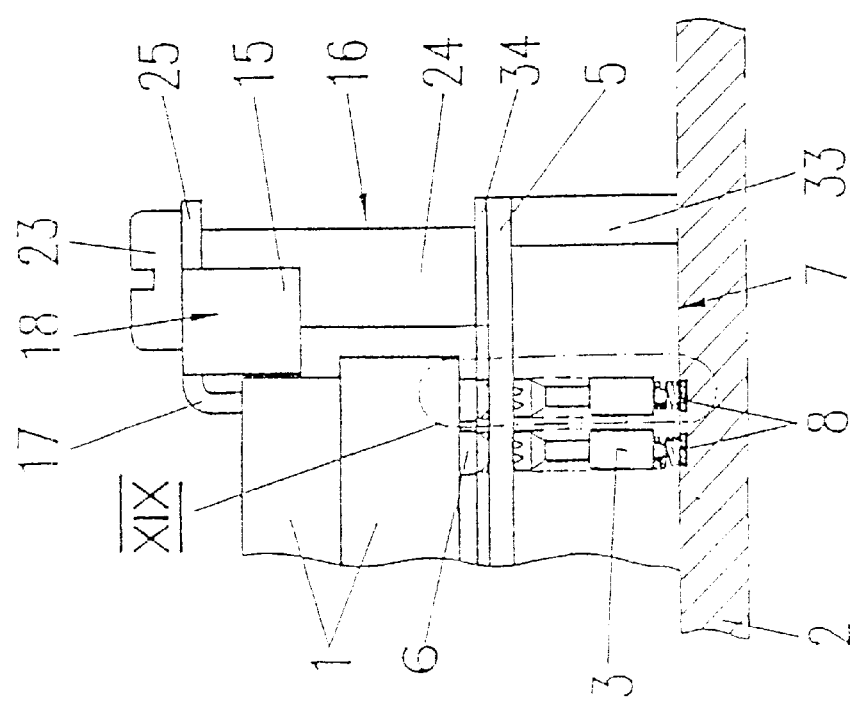

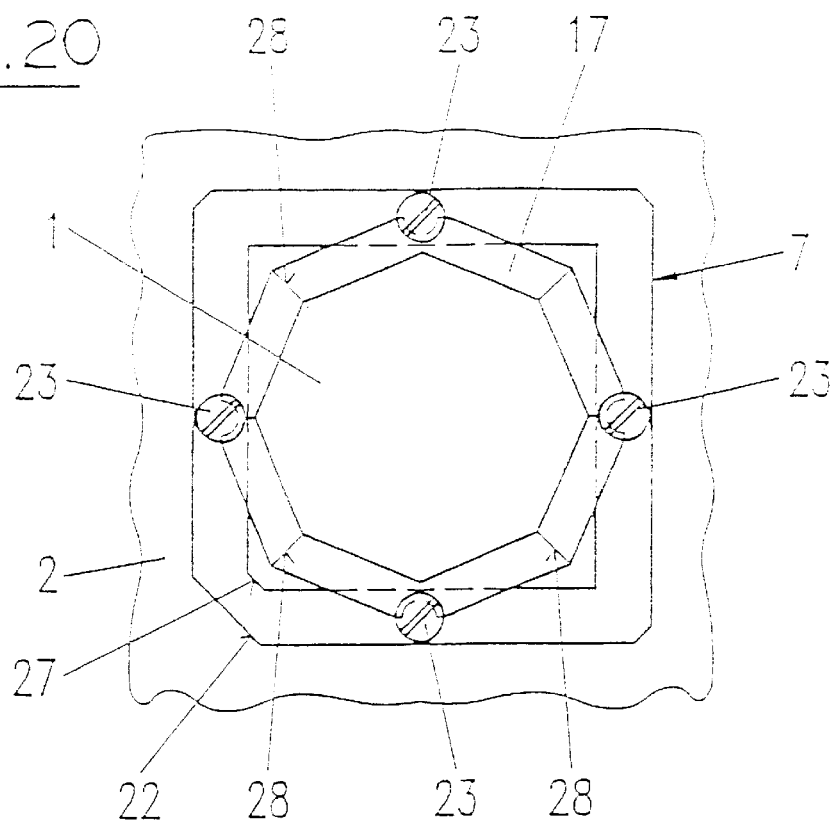
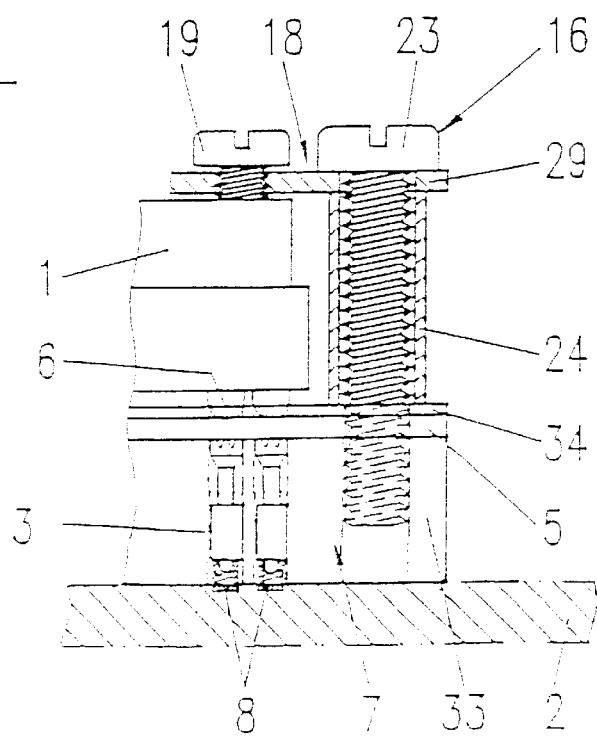

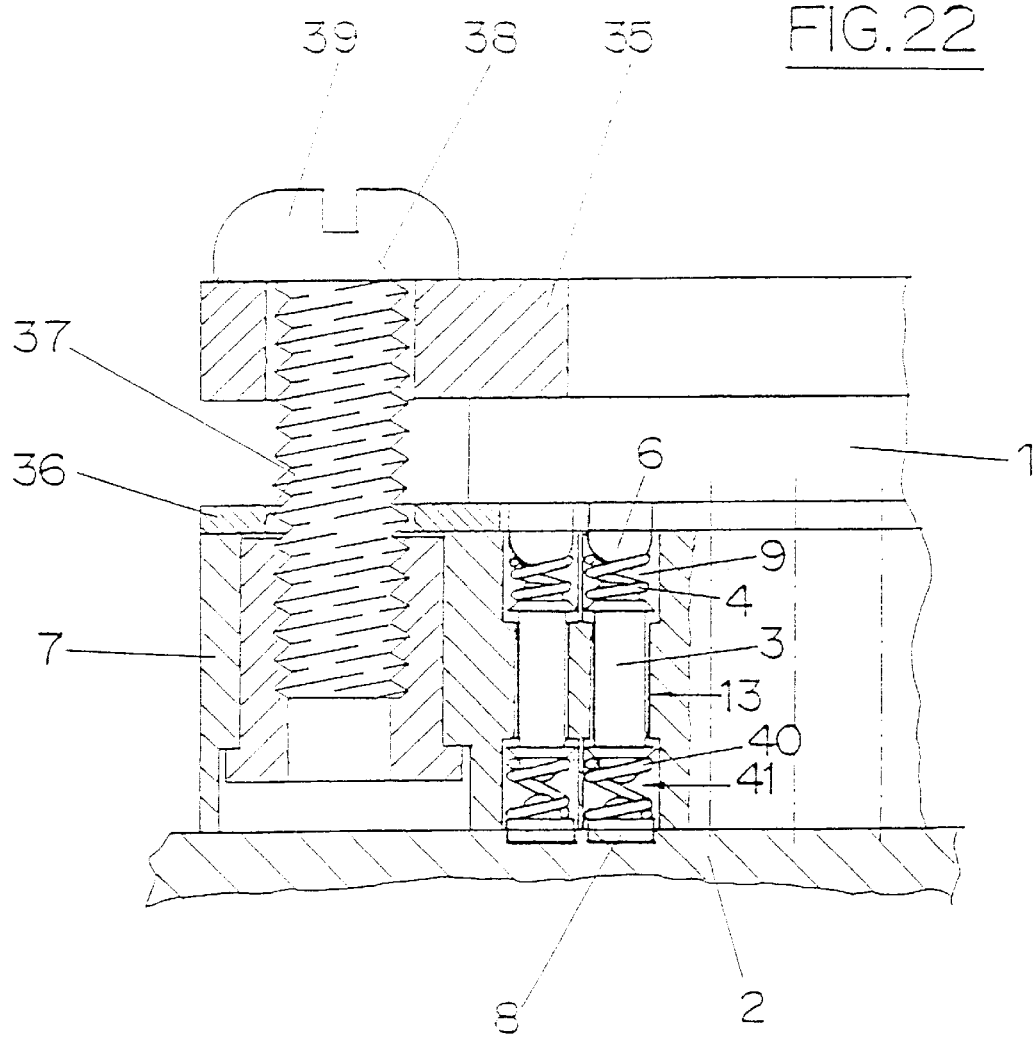

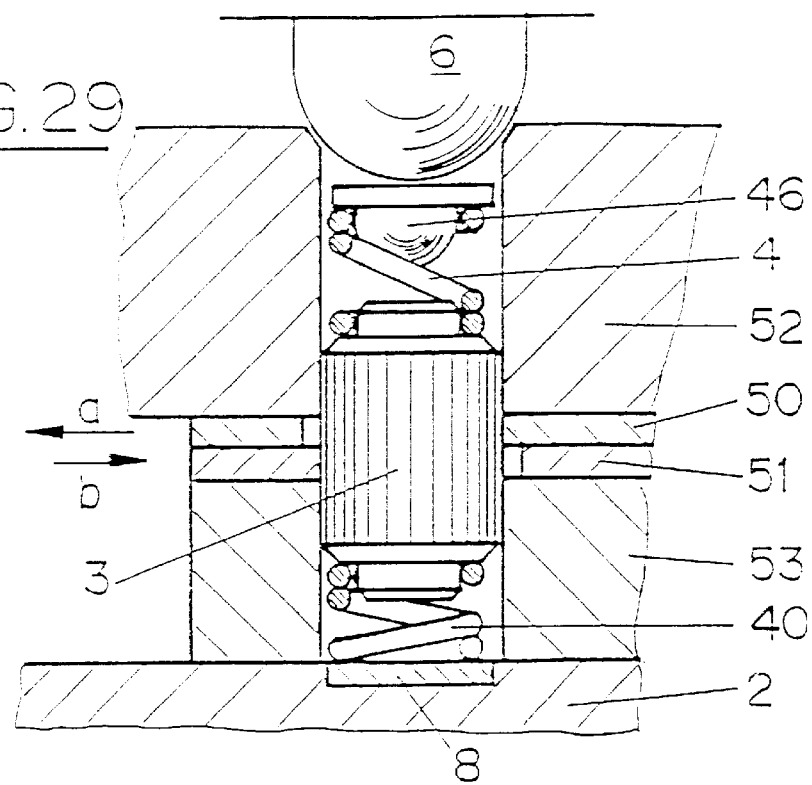
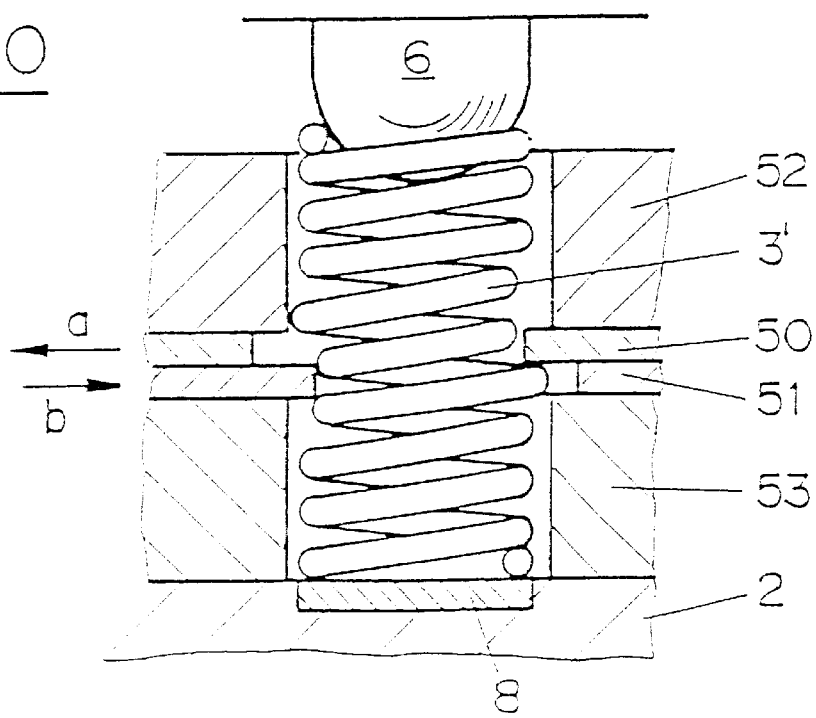

FIG. 34
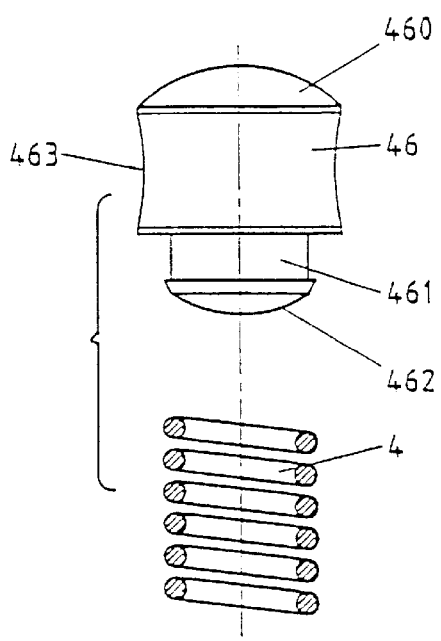
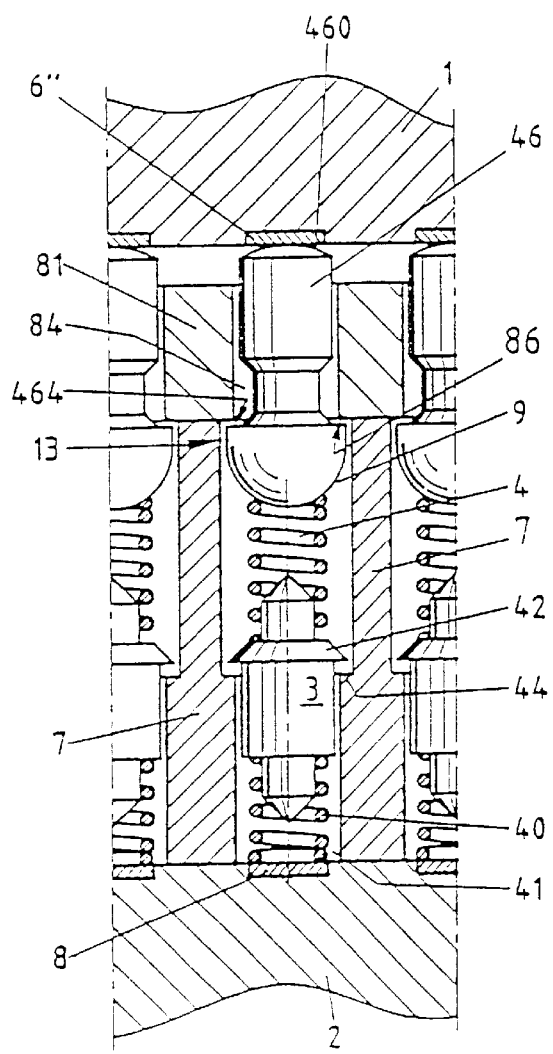
FIG. 35

CONNECTION BASE

This application is the national phase of international application PCT/CH97/00184 filed May 12, 1997 which designated the U.S.

The present invention relates to a base permitting a second electric component comprising a plurality of connection fingers disposed in matrix form, for example a ball grid array (BGA), column grid array (CGA), land grid array (LGA), or flip-chip type integrated circuit, to be detachably attached to a first electric component, for example a printed circuit board. However, the present invention also relates to bases permitting board-to-board connections to be effected between printed circuit boards.

The technology and the production methods of integrated circuits have constantly improved during the last few years. Despite the constant improvement of the resolution used for manufacture, an increase in their surface is also being witnessed. An important problem posed by this evolution of the complexity of the integrated circuits is that of connection to other components. Currently, the number of fingers necessary may easily exceed 600. Parallel thereto, the distance between the fingers tends to be constantly reduced. A spacing of 0.5 mm between the fingers is common nowadays, while finger spacings of 0.4 and even 0.3 mm are already making their appearance.

Such VLSI circuits can turn out to be very expensive, particularly when it is a question of microprocessors used in information technology. Consequently, connection bases have been conceived which can be soldered on the paths of a printed circuit board in lieu of the integrated circuit. These connection bases are designed so that an integrated circuit can easily be plugged in and pulled out or replaced at any time. In particular, one aim of these bases is to permit the replacement of an integrated circuit comprising a large number of fingers without the risk of bending the fingers or destroying the paths or the other components of the printed circuit at the time of unsoldering.

Pin Grid Array (PGA) type circuits are tending to become more and more widespread alongside conventional PLCC type circuits. Assembly bases adapted to PGA circuits comprise a large number of contact pins disposed in the same way as the connectors of the integrated circuit. One end of the contact pins is intended to be inserted and soldered in the hole mask of the printed circuit, while the other end is configured in the form of a female connector provided with a clip and capable of receiving and establishing electrical contact with the corresponding connector of the integrated circuit.

This type of assembly base unfortunately requires considerable force for inserting and withdrawing integrated circuits comprising a large number of fingers. There is thus a risk of damaging the integrated circuit. What is more, centering the circuit above the base is not always easy, so that the fingers of the integrated circuit may bend or even break if it is attempted to insert it when it is not well centered.

The problem of connection is likewise posed with surface-mounted circuits, according to the so-called SMD technology. Known, for example, are circuits in which the fingers are disposed in matrix form (Grid Array), the fingers having the shape of part of a sphere, preferably a hemisphere. This configuration is known by the designation Ball Grid Array (BGA) or, in the case of Motorola, IMPAC (Overmold Plastic Pad Array Carrier). It is described, for example, in the German journal Megalink, Nos. 13-1995 and 17-1995, respectively, in a series of articles by Bernard Schuch entitled "Ball Grid Arrays (1)" and "Ball Grid Arrays (2)," respectively. The fingers of these integrated circuits are directly soldered to the contact surfaces of the printed circuit. It is very difficult afterward to remove and replace an integrated circuit, in case of a defect, for example, without risking the destruction of the printed circuit. The wastage rate of such printed circuits which can no longer be used afterward is consequently high.

Other types of connector configuration for integrated circuits have also been conceived. Column Grid Array (CGA) type circuits are similar to the BGA circuits but comprise fingers in the shape of little columns rather than in the shape of spherical sections. Also known are Land Grid Array (LGA) type circuits or still others in which the problem of mounting on the printed circuit is similarly posed.

One object of the present invention is to propose a connection base permitting an integrated circuit, for example of one of the above types, to be detachably mounted on a printed circuit board. A reliable contact must be guaranteed even when the number of connection fingers is very large, and the force to be applied for inserting or removing the circuit must be sufficiently reduced to exclude any risk of destroying the integrated circuit.

Another object of the invention is to guarantee a good-quality, homogeneous electrical contact with all the pins of the base.

According to another object of the invention, the size and particularly the thickness of the base must be as small as possible in order to permit its use in miniaturized devices as well.

According to another object of the invention, the design must be simplified or optimized to permit low-cost production, especially in the case of large-scale mass production.

Another object of the invention is to propose a base permitting board-to-board connections to be effected between different printed circuits. Thereafter, whenever it is a matter of an electric component inserted on the base, it will therefore be necessary to generalize in the case where the electric component itself is composed of a second printed circuit board. In the same way, whenever it is a matter of fingers of the electric component. It will have to be understood that in the case where said component is composed of a printed circuit, fingers are likewise understood to mean the paths of this printed circuit.

These objects are achieved according to the invention by means of a base permitting a second electric component, for example an integrated circuit, comprising a plurality of connection fingers, to be detachably attached to a first electric component, for example a printed circuit board, comprising a support held between the two electric components and provided with a plurality of through openings disposed in the same way as said connection fingers, a plurality of pins extending substantially perpendicular to the support. One end of each pin is intended to be placed in electrical contact with at least one connection element of the first electric component, while the other end is intended to be placed in electrical contact with a connection element of the second electric component mounted. A pin is disposed in each of said through openings and held longitudinally only loosely within said through openings. A space is contrived between one end of each pin and the corresponding connection element of the first electric component, and/or between the other end of each pin and the corresponding connection element of the second electric component mounted. An electrically conductive compressible element is housed in at least one of said space or spaces, so as to permit an electrical contact between each pin and the corresponding connection element of the first electric component and/or the corresponding connection element of the second electric component mounted.

No particular means are provided for longitudinally holding the pins inserted in the openings very fixedly, so that the thickness of the base may be minimized. The pins are held in the holes either by stops limiting the movement without totally preventing it, or by friction on the side surfaces, for example. In the case where an electrically conductive compressible element, for example a spiral spring, is provided on each side of each pin, the force of each spring may be balanced by longitudinal movement of the pin in the opening, thus guaranteeing a homogeneous pressure of the springs on the connection elements of the two electric components and therefore an improved electrical contact.

The pins may be composed of an elongated element in the shape of a rod and preferably in one piece. In one variant, the pins are composed of a coil spring, itself compressible.

As already indicated, the invention is particularly adapted for a base intended to house an integrated circuit but may also be suitable for bases capable of receiving any type of electric component having an arrangement of similar fingers. The invention is moreover perfectly adapted to "flip-chip" type designs or to the interconnection between two printed circuit boards.

U.S. Pat. No. 4,508,405 describes a base comprising a plurality of through openings. A fixed pin is forced into each through opening, while a second movable pin can slide longitudinally in the opening, the two pins being separated by a space in which a spring is housed. Two pins must be machined per opening. One of the pins is forced, implying that the base support must be sufficiently thick to resist deformations. The detachable components fixed are directly in contact with the pins, which does not guarantee an optimum electrical contact with all forms of connection fingers.

Patent document DE3832410 describes a contact device for a test device. The teaching of this document is not directly transposable to the field of connection bases for detachable electric components.

The objects of the invention are moreover achieved by means of contact plates which can be mounted at the end of the electrically conductive compressible elements. These plates may be used either with fixed-pin bases or with movable-pin bases.

The present invention will be better understood with the aid of the variant embodiments described hereafter by way of example and illustrated by the figures, which show:

FIG. 1, a side view of a first base variant on which the integrated circuit is held by means of four lateral screws.

Figure 2:
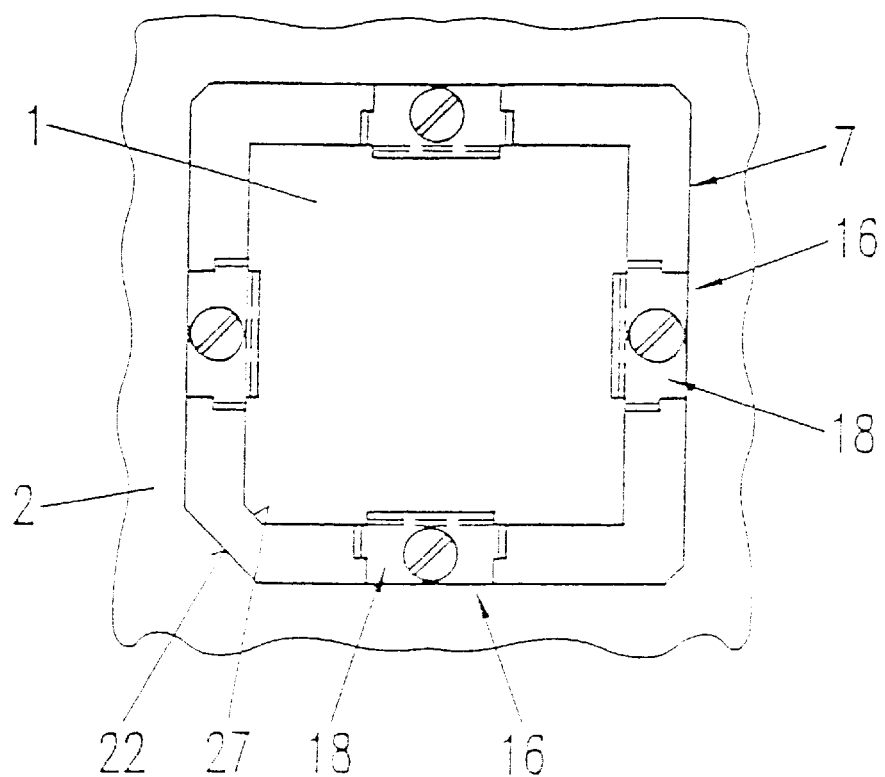

FIG. 2, a top plan view of the first base variant.

Figure 3:
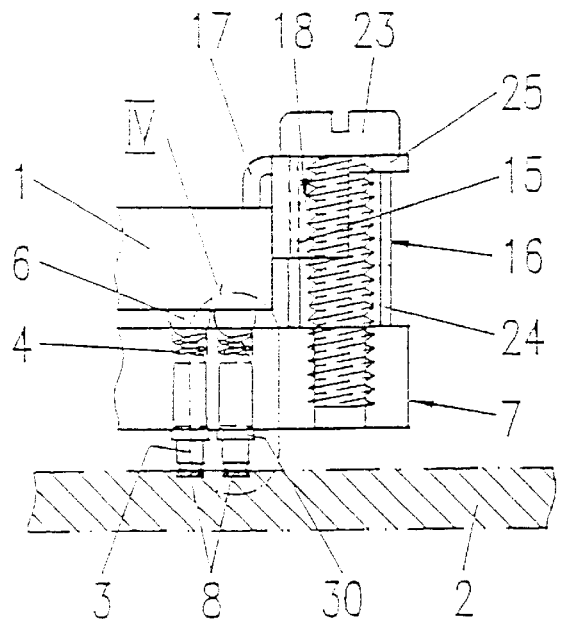

FIG. 3, an enlargement of a portion of the base designated as III in FIG. 1.

Figure 4:
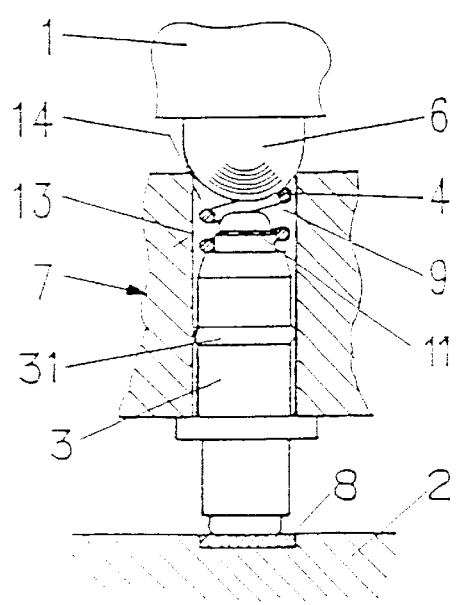

FIG. 4, an enlargement of a portion of the base designated as IV in Figure III [sic] and corresponding to a single pin through a base described in another application.

FIGS. 5 to 14, enlargements of the same portion of the base according to diverse variants of the invention.

Figure 15:
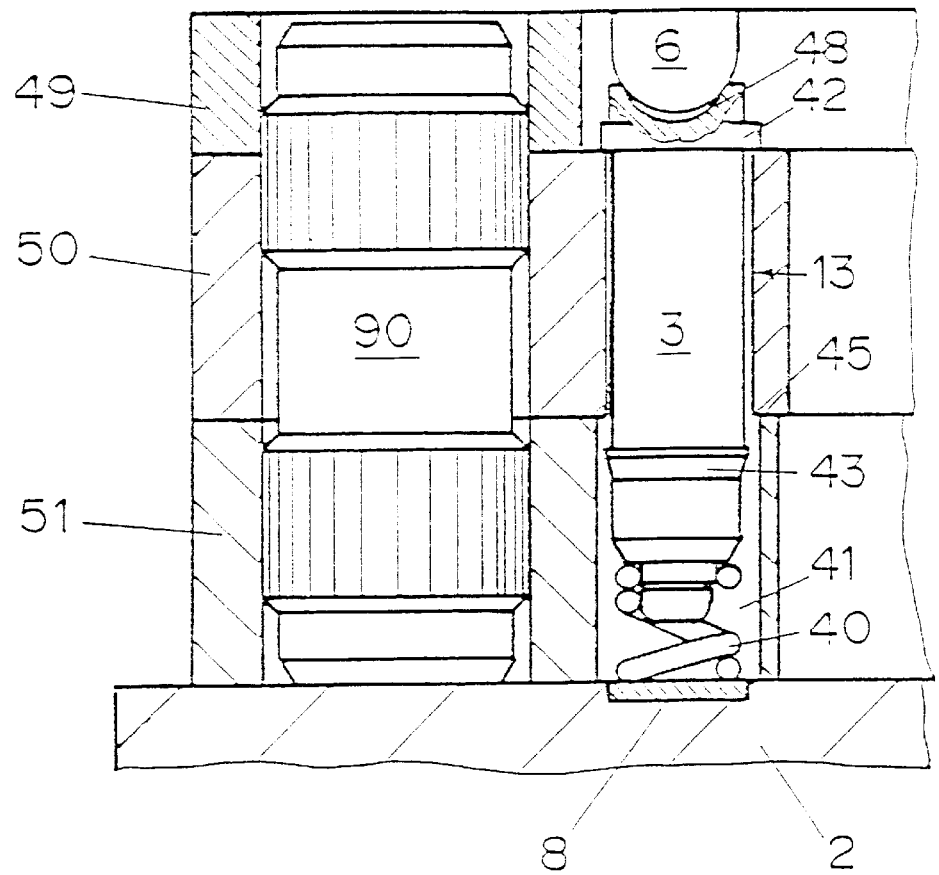

FIG. 15, an enlargement of the same portion of the base in a variant adapted to Ball Grid Array type circuits, in which the centering of the integrated circuit is ensured by means other than the through openings in the base.

Figure 16:
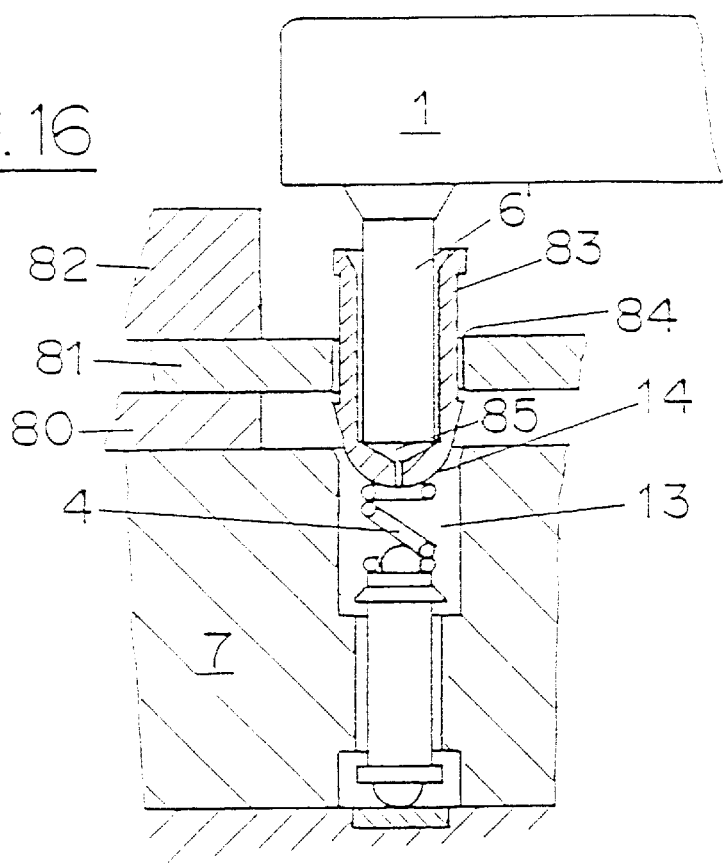

FIG. 16, an enlargement of the same portion of the base in a variant adapted to Column Grid Array type circuits.

Figure 17:
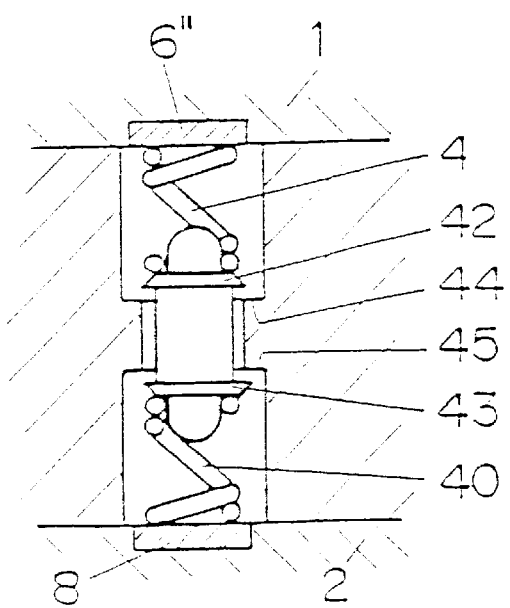

FIG. 17, an enlargement of the same portion of the base in a variant adapted to Land Grid Array type circuits.

FIG. 18, an enlargement of the portion of the base corresponding to that depicted in FIG. 3, in a variant of the invention using an elastic mat.

FIG. 19, an enlargement of a portion of the base designated as XIX in FIG. 18 and corresponding to a single pin through the base in a variant comprising an elastic mat used as a compressible element.

FIG. 20, a top plan view of a base according to the present invention in which the pressing means of the electric component are composed of a spring.

FIG. 21, an enlargement of a portion of a base according to the present invention in which the pressing means of the electric component are composed of holding plates and screws.

FIG. 22, an enlargement of a portion of a base according to the present invention in which the pressing means of the electric component are composed of a holding frame.

Figure 23:
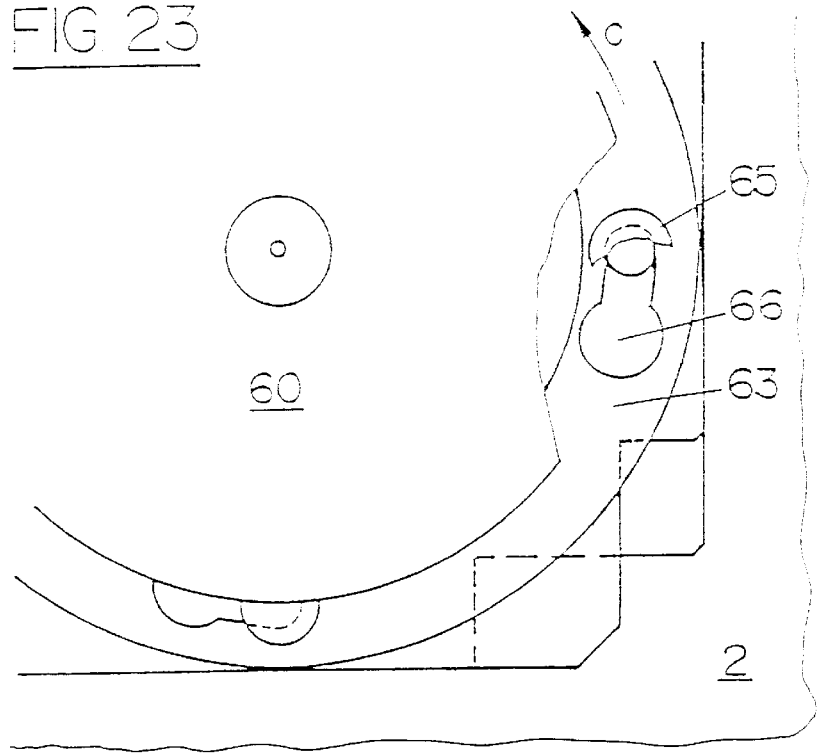

FIG. 23, a top plan view of a base according to the present invention in which the pressing means of the electric component are composed of a radiator screwed above the integrated circuit.

Figure 24:
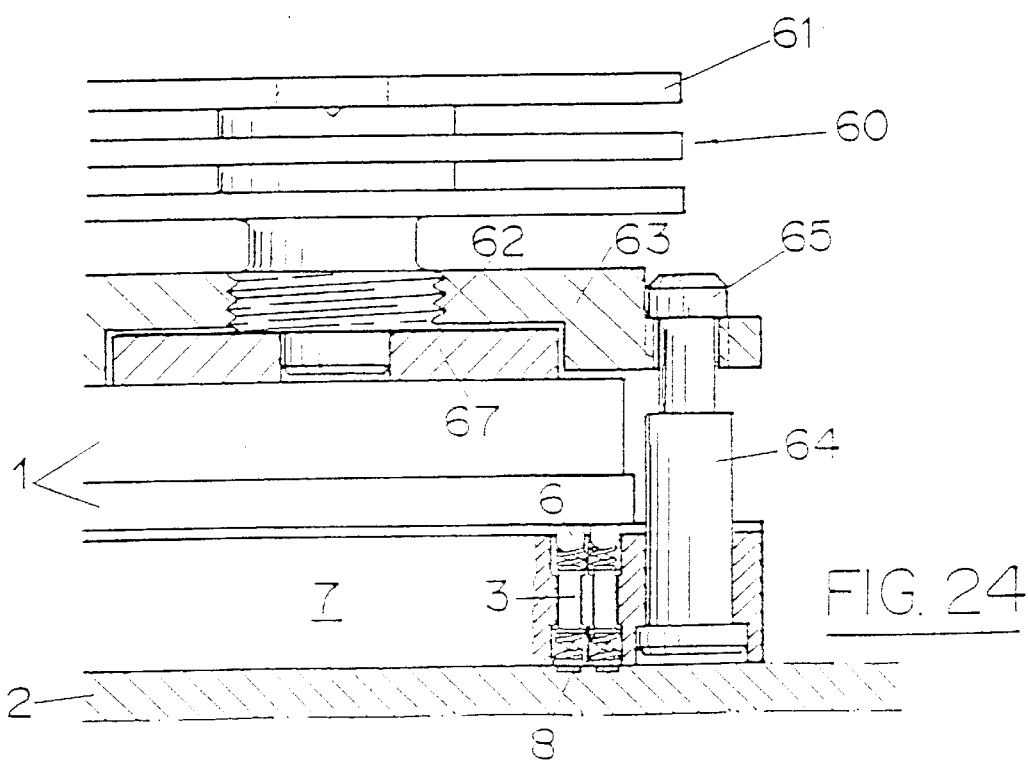

FIG. 24, a section through a portion of a base according to the variant of FIG. 23.

Figure 25:
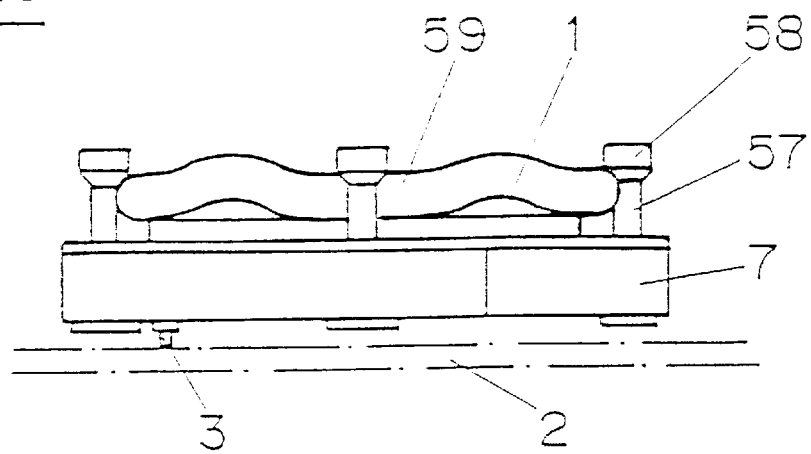

FIG. 25, a side view of a portion of a base on which the electric component is held by a clip spring.

Figure 26:
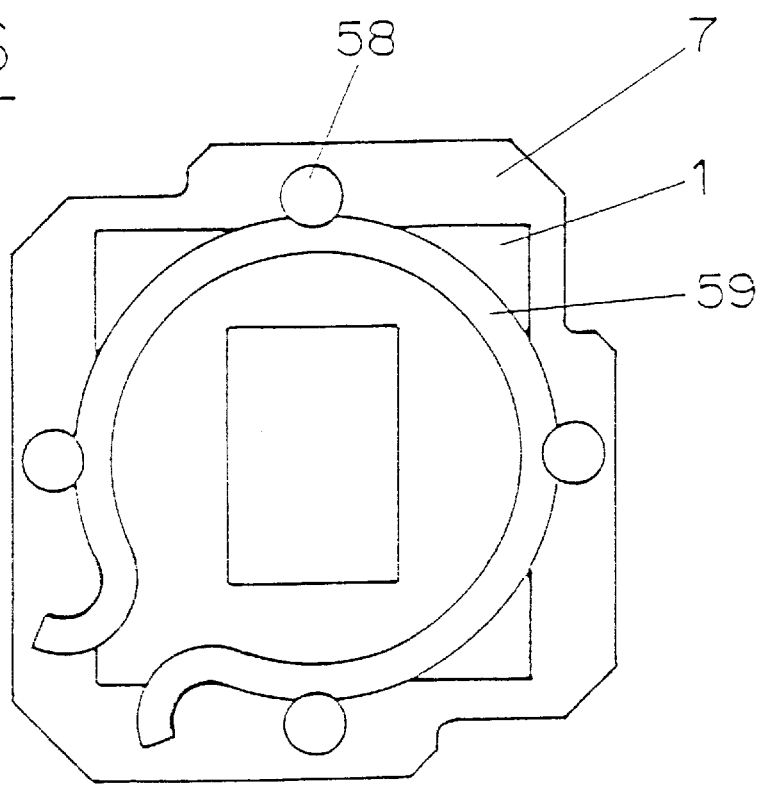

FIG. 26, a top plan view of a base according to the variant of FIG. 25.

Figure 27:
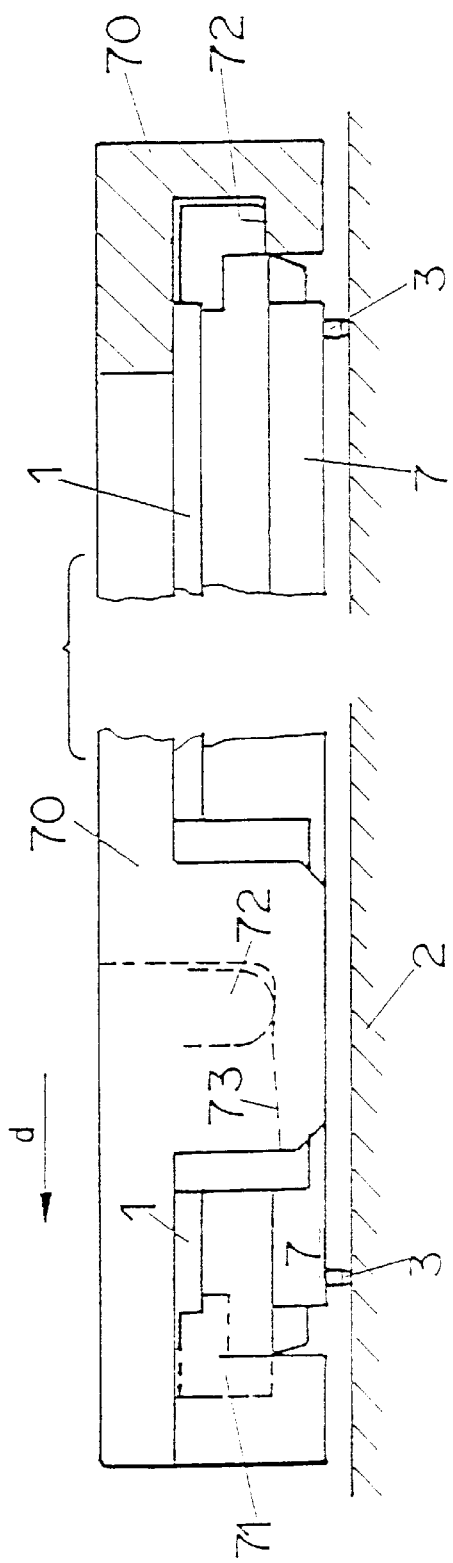

FIG. 27, a side view of a base according to the present invention on which the electric component is held by a self-locking small gag (cam lock).

Figure 28:
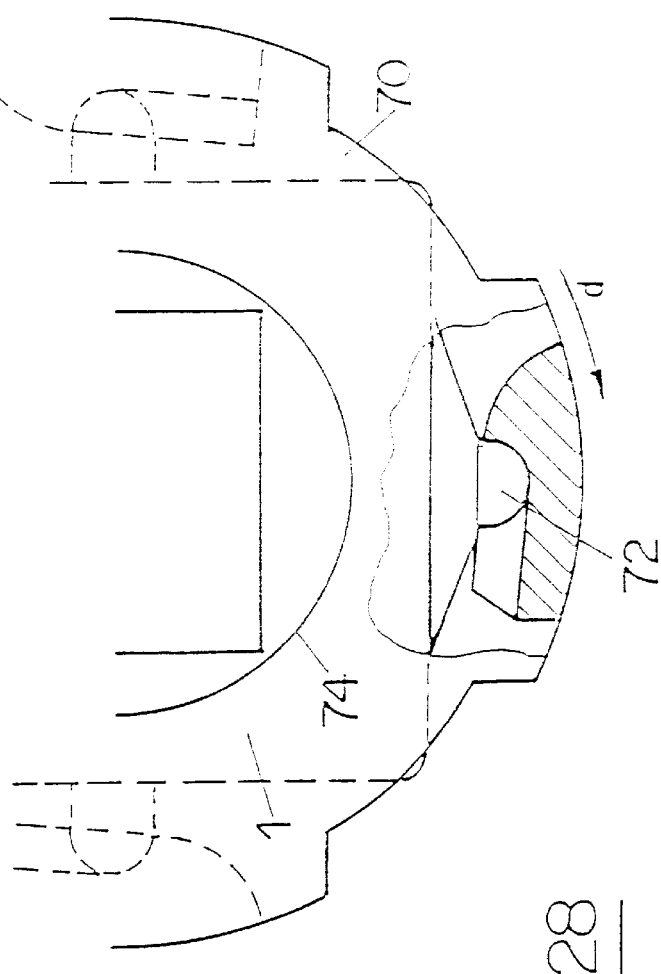

FIG. 28, a partial top plan view of a base according to FIG. 27.

FIG. 29, a section through a base portion with a single pin, the pin being held within the opening by two sliding plates.

FIG. 30, a section through a base portion with a single pin, the pin being of the coil spring type and held within the opening by two sliding plates.

Figure 31:
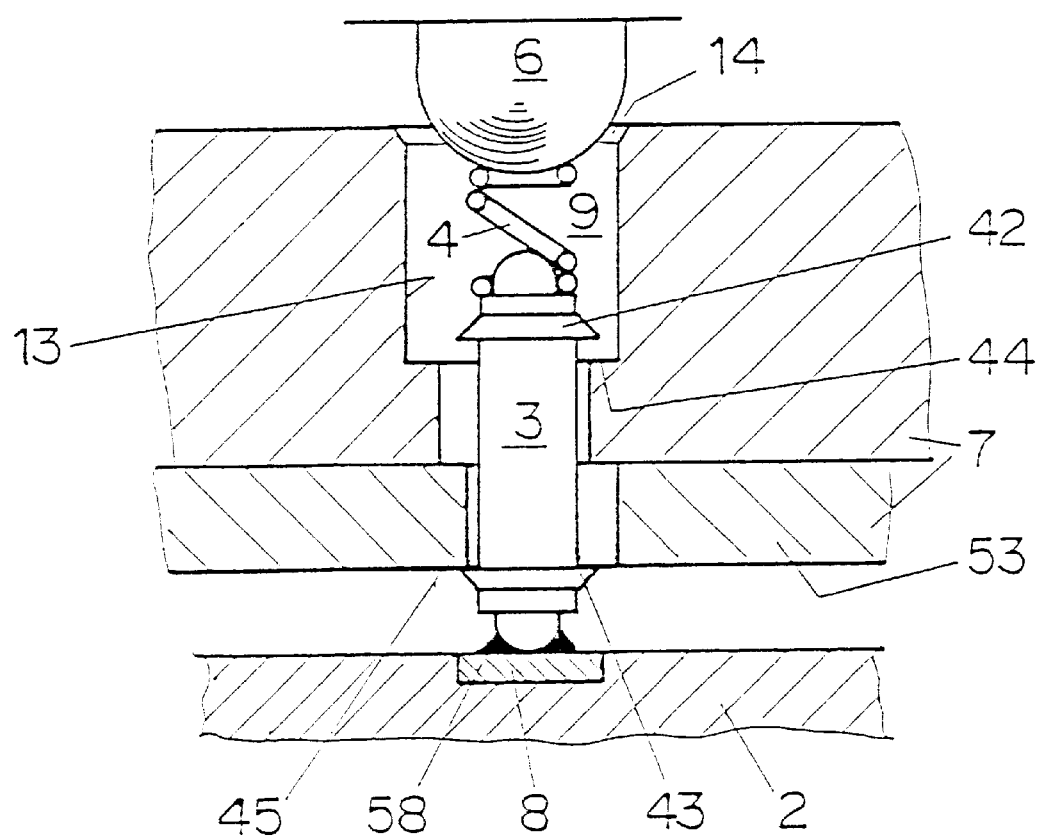

FIG. 31, a section through a base portion with a single pin, the pin being soldered on the printed circuit and held within the opening by two sliding plates, the base being withdrawable by moving the sliding plates apart to check the condition of the soldering.

Figure 32:
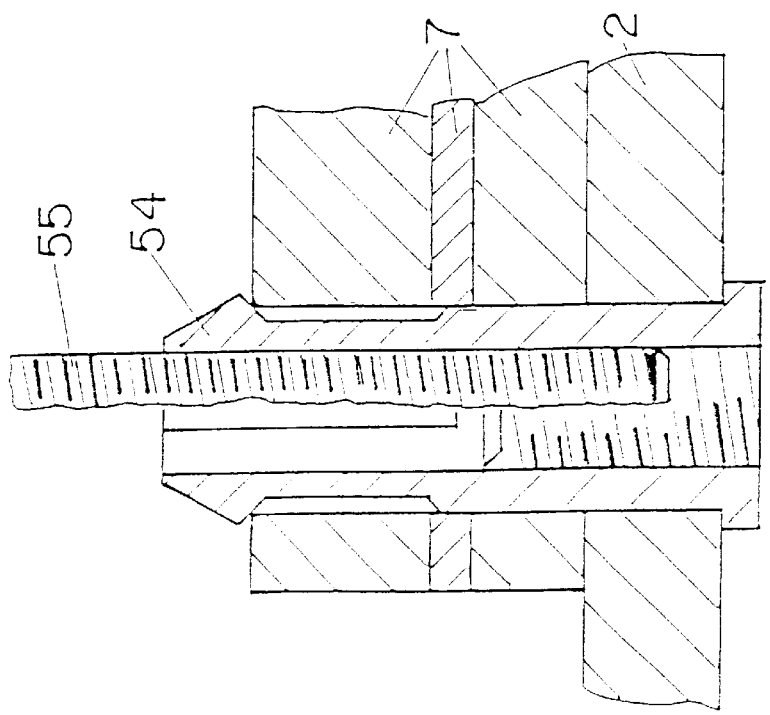

FIG. 32, a section through a stud-bolt permitting several plates constituting the support of the base to be centered and mutually positioned, the stud-bolt passing through the printed circuit.

Figure 33:
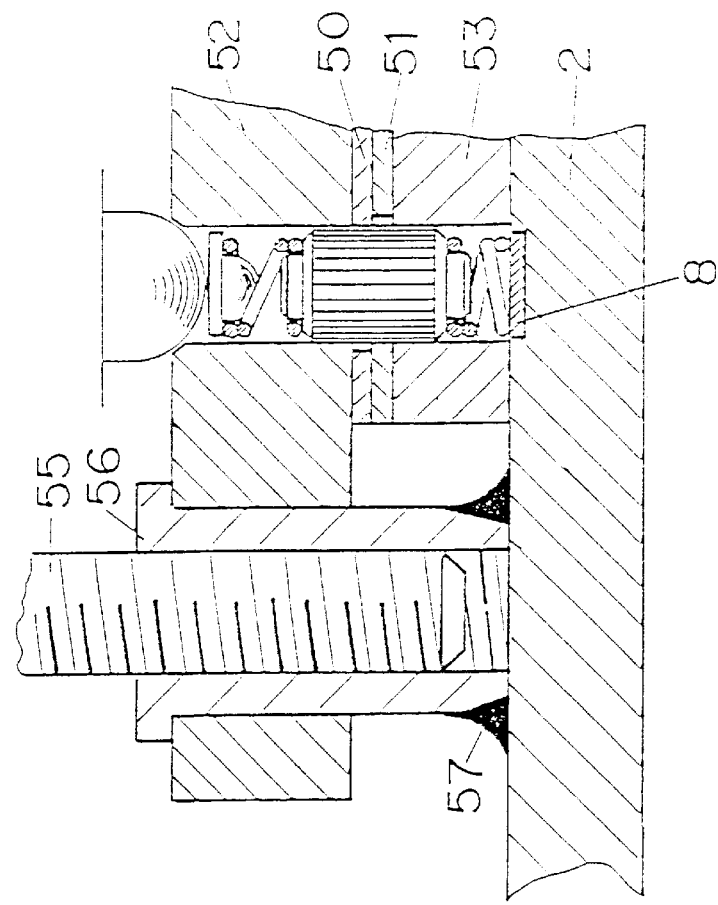

FIG. 33, a section through a stud-bolt permitting several plates constituting the support of the base to be centered and mutually positioned, the stud-bolt being soldered to the printed circuit.

FIG. 34, a section through a base portion illustrating in particular a first retaining means of a contact plate.

FIG. 35, an exploded detail of the coil spring and the contact plate attached according to a retaining means variant of the invention.

FIGS. 1 to 4 illustrate a base variant already described in application WO96/38030, the contents of which are incorporated herein by reference. All the characteristics described in this application, aside from those relating to the longitudinal mobility of the pins 3, equally apply to the bases according to the present invention.

The (second) electric component 1, for example an integrated circuit, comprises a certain number of fingers 6 on its lower face near the printed circuit 2 (first electric component). The fingers are disposed according to a matrix (grid array) occupying practically the whole lower surface of the integrated circuit 1. Depending on the component, the matrix may also be reduced to one or more matrices. In the example shown, the fingers 6 have the shape of a sphere portion, more particularly of a hemisphere. This arrangement and this shape of fingers are known by the Anglo-Saxon designation Ball Grid Array (BGA). As we shall see below, the invention also applies to bases intended to house other types of circuit, for example of the Column Grid Array (CGA) type, Land Grid Array (LGA) type, flip-chip type, or for board-to-board connections.

It is naturally not indispensable for the fingers to be distributed over the whole lower surface of the integrated circuit; variants may easily be conceived by the specialist for circuits wherein the lower face comprises one or more regions devoid of fingers, or for an arrangement of fingers in two columns, in a cross-shape, etc.

The base comprises an at least partially flat support 7 held between the printed circuit 2 and the electric component 1. This support is, for example, composed of a plate of epoxy or of thermoplastic material and may be obtained either by cutting and machining operations starting from a plate, or by molding. It is traversed by a plurality of openings 13 disposed in the form of a matrix corresponding to the distribution matrix of the fingers 6 of the integrated circuit 1. An electrically conductive pin 3 is disposed within each opening 13. In FIGS. 3 and 4, these pins pass through the support 7 and protrude below the lower surface of the base. The bottom end of these pins is substantially flat, so as to be solderable on the paths 8 of a printed circuit 2. This type of mounting is generally known by the name of surface-mounting of parts (SMD: Surface Mounted Device). A stop 30 limits the depth of penetration of the pins 3 within the openings 13. In the case of soldered pins, this stop 30 further keeps the solder from rising in the openings 13 by capillary action and blocking the pins 3.

The circuit 1 is placed over the flat support 7 so that its fingers slightly enter the corresponding openings 13. The side surfaces of the upper end 14 of the openings 13 permit the integrated circuit 1 to be guided and positioned precisely above the base. We shall see below that the integrated circuit 1, particularly if it is of the LGA type, may also be centered with other means, for example with a centering frame. A space 9 is contrived between the top end of the pins 3 and the corresponding connection finger 6 of the electric component mounted. Each space is short-circuited by an electrically conductive metal coil spring 4 so as to permit an electrical contact between each pin 3 and the corresponding connection finger 6 of the electric component mounted. The top end of each pin is adjusted so as to retain the spring in the opening 13 even when the circuit 1 is removed from the base. The bottom turn of the spring is inserted about the pin head 11, the resilient holding force of the spring about the head being sufficient for the spring to remain joined to the pin even when the base is turned over or shaken, for example. This configuration presents the advantage of not requiring any expensive soldering between the spring 4 and the pin, and makes it possible to produce a spring and a pin of different materials adapted to their respective specifications.

The springs 4 are slightly compressed when the integrated circuit is in place and thus guarantee an electrical contact of very good quality, even when the fingers 6 and/or the pins 3 have slightly different lengths because of irregularities of manufacture or wear. The force necessary to insert the integrated circuit 1 on the base corresponds only to the force necessary to compress the springs 4. As there is no axial friction between the fingers 6 and the side surfaces of the openings 13, this force is very limited, thus precluding any risk of bending or breaking fingers. The length chosen for the springs 4 is preferably such that they do not protrude (or very little, less than 0.2 millimeters) above the openings 13, even when the component 1 is not mounted. In this way, the fingers 6 of the integrated circuit 1 are perfectly directed by the side surfaces of the upper end of the opening 13 from the beginning of the insertion of the circuit 1 on the base. Furthermore, this configuration permits the end of the spring 4 to be centered perfectly opposite the finger 6, which would not be the case if the springs protruded freely above the openings 13. The diameter of the springs is constant over their entire length, or at least symmetrical in relation to the middle of the spring, which permits them to be assembled by vibration without checking which end of the spring enters the opening first. The number of turns of the spring is limited, preferably being between 2 and 5, in order to reduce the resultant inductance of the contact and to permit the base to be used for connecting integrated circuits operating at high frequency.

Means 16 for pressing the integrated circuit against the pins are provided in order to guarantee a perfect and homogeneous contact between all the fingers 6 of the circuit 1 and the corresponding pins 3. In FIGS. 1 to 3, these pressing means 16 are composed of four pressing elements 18, each element 18 pressing substantially on the middle of one of the faces of the circuit 1. Each element 18 is traversed by a holding screw 23 fitted in an opening of the support 7 provided for that purpose. The holding screw 23 further passes through a small column 24, the bottom end of which rests against the support 7, while a plate 25 is inserted between its top end and the head of the screw 23. The plate 25 comprises a bend 17 which extends over the upper face of the circuit 1. When the screw is sufficiently inserted in the support 7, the end of the bend 17 rests against the upper face of the circuit 1 which is in this way pressed against the support 7. A suitable adjustment of the four screws 23 permits an equal pressure to be exerted on the middle of each of the sides of the integrated circuit 1 and thus to guarantee a homogeneous contact between all the fingers 6 and the associated pins 3.

A marking 22, composed in FIG. 2 of a cut corner of the support 7, corresponds to an equivalent marking 27 on the circuit 1 and permits the circuit 1 to be oriented when it is placed on the base.

In patent application WO96/38030 mentioned above, the pins 3 are fixed within openings 13 so as to exclude any possibility of longitudinal movement. Stops 30 and ribs 31 are provided expressly for this purpose. FIG. 4 illustrates a pin 3 provided with such a rib according to the teaching of this document; the other characteristics illustrated and described in relation to this figure all form part of the present invention. Such a rigid fastening preventing any movement is not, however, always desirable. When the length of the pins 3 is not strictly uniform, for example owing to machining tolerances, it may be preferable to have pins capable of moving slightly within the openings, so as to distribute the possible errors between the bottom end and the top end of the pin. Moreover, the ribs 31 on each pin 3 cause tensions in the base support 7, and possibly even deformations or bending. It is therefore necessary to reinforce the base support 7 by giving it a certain thickness, which is contrary to the object of the invention which is to minimize the thickness. Specific machining operations must furthermore be provided for making these ribs 31 and these stops 30.

According to the present invention, the pins 3 are not blocked longitudinally within the openings 13 but only held loosely and weakly within the openings, so as to be able possibly to move slightly. Even if the pins cannot really move easily because of the friction against the walls of the openings 13, at least nothing is expressly provided for blocking them longitudinally. Furthermore, it is understood that the pins 3 are movable only as long as the base is not attached to the printed circuit and no integrated circuit is inserted on the base.

According to an important preferential characteristic of the invention, the diameter of the pins 3 is close to the diameter of the openings 13, and the clearance between the pins and the openings is preferably less than or equal to 0.1 millimeter. The pins are thus held by friction against the sidewalls of the openings 13, with a holding force at least equal to the weight of the pins, in order to be able to turn the base over without the pins falling out of the holes (particularly in the variants without stop 30). However, contrary to the above-mentioned previous application, the clearance between the pins and the openings is sufficiently great to permit a certain longitudinal movement of the pins. This very small clearance between the pins 3 and the openings 13 further permits infiltrations of liquid solder into the openings by capillary action to be avoided.

FIGS. 5 to 14 illustrate different examples of pins 3 held loosely within openings 13, corresponding to different variants of the present invention capable of being easily adapted to a base such as that described in FIGS. 1 to 3.

In the variant of FIG. 5, the finger 6 of the integrated circuit 1 is in direct contact with the corresponding pin 3, no space 9 nor any compressible element 4 being provided between the finger 6 and the top end of the pin. A space 41 is, however, contrived between the bottom end of the pin 3 and the corresponding path 8 of the printed circuit 2. The space 41 is short-circuited by a spring 40 which establishes an electrical contact between the pin 3 and the path 8 on the printed circuit 2.

The pin 3 is not fixed longitudinally in the opening 13 but is, on the contrary, capable of moving slightly. The extent of the movement is limited by two projections 42 and 43, respectively, contrived at the top and bottom ends, respectively, of the pin 3 and by an offset 45 contrived in the opening 13. When the base is mounted on the printed circuit 2 but no integrated circuit is installed in the base, the spring 40 causes the pin 3 to emerge out of the opening 13, the projection 43 resting in this case against the offset 45. When the integrated circuit 1 is inserted and pressed against the base 7 by pressing means not shown, for example of the type of those illustrated in FIGS. 1 to 3, the pin 3 redescends while compressing the spring, preferably until the projection 42 contrived on the pin comes to rest against the upper surface of the base 7. The spring 40 exerts sufficient pressure on the pin 3 to guarantee a contact of good quality between the pin 3 and the corresponding finger 6, even if the fingers 6 do not all have strictly the same length or if the thickness of the base 7 is not strictly constant. In the variant of FIG. 6, the pin 3 is in direct contact with the path 8 of the printed circuit 2. No space 41 nor any compressible element 40 is provided between the bottom end of the pin and the printed circuit. On the other hand, in the same way as in the variant of FIG. 4 already described in the patent application mentioned above, a space 9 is contrived between the top end of the pin 3 and the corresponding finger 6 of the integrated circuit, this space being short-circuited by an electrically conductive compressible element, here by a metal coil spring 4. The side surfaces of the upper end 14 of the opening 13 serve as guidance, permitting the circuit 1 to be centered precisely above the base, in the way indicated above.

The pin 3 is not fixed within the opening 13 but can move slightly. An upper projection 42 and a lower projection 43 respectively cooperate with an upper stop 44 and a lower stop 45, respectively, to limit the extent of the possible movement of the pin 3 within the opening and, for example, to keep the pin from being able to leave the opening. We shall see below other possible means for limiting the possible movement of the pins 3. Before the integrated circuit 1 is inserted in the base, the pin 3 therefore floats more or less freely in the opening 13. When the integrated circuit is inserted 1 in the base and pressed against the support 7 by some pressing means not shown in this figure, the pin 3 comes to rest directly against the corresponding path 8. The resting pressure is given by the spring 4, which is compressed with sufficient force to guarantee a contact of good quality between the pin 3 and the corresponding path 8, and between the pin 3 and the finger 6. Even when the pins 3 or the openings 13 do not all have strictly the same length, an electrical contact of very good quality may in this way be effected between all the pins and the fingers and the corresponding paths.

In one variant of the invention, the pins 3 may also be soldered to the corresponding paths 8 of the printed circuit 2. In this case, the pins 3 are naturally movable only as long as the base is not mounted on the printed circuit 2. It is important in this case to be sure to provide stop elements 30 and/or a very small clearance between the pins and the openings to prevent infiltrations of solder during soldering.

In the variant of FIG. 7, a space 9 is contrived between the top end of the pin 3 and the corresponding connection finger 6. In the same way, a space 41 is contrived between the bottom end of the pin 3 and the corresponding path 8 of the printed circuit 2. As above, the space 9 is shortcircuited by an electrically conductive metal coil spring 4 so as to permit an electrical contact between the pin 3 and the corresponding connection finger 6 of the electric component mounted. The space 41 is short-circuited by a spring 40 which establishes an electrical contact between the pin 3 and the path 7 of the printed circuit 2. In FIG. 7, the springs 4 and 40 are shown with identical diameters and lengths. It may be preferred, however, to have springs of different diameter and/or length.

Once more, the pin 3 is not totally fixed within the opening 13 but can move slightly, the amplitude of the possible movement being limited by stops 44, 45, respectively, cooperating with projections 42, 43, respectively.

An optimum electrical contact may be difficult to obtain with coil springs of the type 4 or 40. In particular, the contact is liable to be of lesser quality if the spring 4 has a last turn toward the finger 6 of the integrated circuit very slanted instead of being substantially horizontal. In this case, the contact is liable to be established only between a reduced portion of the last turn and the pin 6 [sic]. The end of the spring 4 may furthermore become damaged in case of repeated insertion and extraction of the integrated circuit in the base. The problem is posed similarly for the contact between the spring 40 and the path 8, and is particularly crucial in case of contact between a spring and the finger of an LGA circuit.

The variant illustrated by FIG. 8 permits this problem to be solved by means of contact plates 46 and 47. The upper contact plate 46 comprises a substantially plane or concave upper surface adapted so as to guarantee an optimum contact with the finger 6. The lower surface of the plate 46 preferably comprises a spur (not referenced) inserted within the coil spring 4 so as to guarantee likewise sufficient electrical contact and holding of the plate in the spring. The plate may also be soldered or joined integrally in any manner to the spring 4, 40. The lower contact plate 47 may be of the same type as the plate 46 or be specially designed to facilitate the contact and the soldering with the plane surface of the path 8 of the integrated circuit 2.

It is naturally also possible depending on the needs to use only one lower contact plate 47, as illustrated in FIG. 9, or only one upper contact plate 46, as illustrated in FIG. 10. The specialist will immediately see that lower contact plates 47 may also be used with the variant of the invention illustrated by FIG. 5, and that upper contact plates 46 may also be used with the variant of the invention illustrated by FIG. 6. Moreover, such contact plates may likewise be used for bases with fixed pins such as are described in the above-mentioned application.

The contact plates 46 and 47 will be described in more detail below in relation to FIGS. 34 and 35.

In the preceding variants, the metal pins 3 may be slipped in, for example, by forcing them into the support 7 made, for example, of plastic. We shall see below that the base 7 may also be composed of several superimposed plates capable of sliding in relation to one another. In this case, it is possible to slip the pins 3 into the support 7 by dismantling the base 7 by sliding the plates in the appropriate manner.

FIGS. 11 to 14 illustrate four variants of the invention in which the contact pin 3 is composed of a coil spring 3'. Except for this aspect, the variant of FIG. 11 corresponds to the variant of FIG. 7. The pin 3' is composed of a coil spring of a diameter different from that of the springs 4, 40 effecting the electrical contact with the finger 6 or with the path 8 of the printed circuit, respectively. The through opening 13 through the base has a shallow annular groove defining two stops 44 and 45. The coil spring 3' may be inserted by deformation in this groove, which then limits its longitudinal movement. Once more, the spring 3' may likewise be inserted by dismantling the base 7 or by sliding the plates constituting the base 7 in the appropriate manner, as will be seen below. It is also possible not to provide any groove nor stops 44, 45, the coil spring 3' being able to be held in the opening 13 by lateral friction and by its tendency to move away.

The coil spring 4, the pin 3', and the coil spring 40 may be composed of a single spring of variable diameter along its length. It is also possible to produce these three elements separately, to solder them, or to join them in some other way, then to insert them, once thus made integral, in the opening 13. Finally, to optimize the contact between the pin 3' and the coil springs 4 and 40, particularly when these elements are not composed of a single element, a connection element, not shown, might be placed ensuring an optimum connection between these different springs.

In the same way as above, it is noted that the position of the pin 3' is not fixed within the opening 13 but, on the contrary, the latter may to a certain extent move and equalize the pressure of the pin with the finger 6 and with the path 8, even in case of differences in thickness.

FIGS. 12, 13, and 14 illustrate variants of FIG. 11 in which the contact plates 46 and 47 are provided to ensure a better contact with the finger 6 and/or with the path 8 and to limit the risk of wear or damaging of the ends of the coil springs 4 and 40.

FIG. 15 illustrates a variant of the invention derived from the variant illustrated by FIG. 5. The identical elements having the same numbering, their description will not be repeated. Upon comparing these two figures, it is noted that a plate 48 is added on at the top end of the pin 3. The shape and/or the material of the plate 48 are chosen so as to ensure the best possible electrical contact between the pin 3 and the corresponding finger 6 of the integrated circuit 1. The plate 48 may also be composed of a gold or silver coating of the top end of the pin 3. The concave shape of the plate 48 further permits the circuit 1 to be easily and precisely centered above the base. In this example, the circuit is of the BGA (Ball Grid Array) type; it is obvious that the shape of the plate 48 will be different if the circuit is of another type, for example CGA (Column Grid Array) or LGA (Land Grid Array).

The support 7 of the base is produced by two superimposed layers 50, 51 on which there is juxtaposed a centering frame 49 permitting the orientation and centering of the integrated circuit 1 to be facilitated. The layers 50 and 51, as well as the centering frame 49, are joined by several positioning pins 90. The plates may be of the same materials or of different materials; we shall see below a variant in which the plates 50 and 51 can slide in relation to one another. Owing to the positioning pins 90, at least two in number, sufficiently spaced and passing through each layer, it is easy to align the layers 49, 50, 51 with optimum precision. The integrated circuit is centered in relation to the pins 3 either by pressing the housing of the circuit 1 against the centering frame 49, or by pressing the outside fingers 6 of the integrated circuit 1 against the frame 49. It is also possible to provide a stepped centering frame 49, the lower part of the steps coming to rest against the outside fingers 6 of the circuit, while the upper part of the steps comes to rest against the housing of the circuit 1.

FIG. 18 illustrates a variant of the invention more specifically adapted to CGA (Column Grid Array) type circuits. As compared with the BGA type circuits, the CGA type circuits are distinguished by fingers 6' made in the shapes of small columns, for example about 2 mm in height.

The lower part of FIG. 16 is absolutely identical to the lower part of FIG. 6, and its description is therefore not repeated here. A spacer frame 80 is placed on the support 7. A socket frame 81 is in turn juxtaposed over the spacer frame 80. The socket frame 81 is pierced by openings 84, the number and arrangement of which correspond to those of the fingers 6' of the integrated circuit 1 and the pins 3 of the base. A metal socket 83 is housed in each opening 84. The outside shape of the socket 83 is provided so as to be able to be forced into the corresponding opening 84 and not to be able to come out of it easily. The inside shape of the socket permits housing a column-shaped finger 6' which can easily enter it without forcing. An opening 85 is contrived in the bottom of the socket 83 which permits the air to leave when the finger 6' is slipped in. A centering frame 82 is juxtaposed over the socket frame 81 and permits the integrated circuit 1 to be positioned and centered easily above the base.

The sockets 83 furnish support to the fingers 6' to keep them from bending, particularly when they are long or made of a fairly soft metal. When, however, the columns 6' are shorter or less liable to bend, the sockets 6' [sic] may be omitted. In this case, bases similar to the bases for BGA circuits may also be used with the CGA circuits, using, if need be, additional spacer frames or adapting the shape of the top ends of the pins 3 or of the upper compressible elements 4. The sockets 83 constitute, in fact, contact plates specially adapted to CGA type fingers.

The specialist will immediately understand that socket frames 81 for CGA type circuits, described here solely in relation to FIG. 16, may also be placed on any base for a BGA circuit especially described in relation to FIGS. 5 to 15 or 29 to 31, and thus permit any of these bases to be adapted to CGA circuits.

FIG. 17 illustrates a variant of the invention more specifically adapted to LGA (Land Grid Array) type circuits. As compared with the BGA or CGA type circuits, LGA type circuits are distinguished by almost flat fingers 6", made in the shapes of small disks directly under the lower surface of the integrated circuit 1.

In this case, the electrical connection between the pin 3 and the fingers 6' of the LGA circuit is effected in the same way as the electrical connection between the pin 3 and the path 8 of the printed circuit 2. FIG. 17 illustrates a base variant for an LGA circuit corresponding to the base variant for a BGA circuit of FIG. 7. As compared with this figure, the diameter and the inclination of the end of the spring 4 are adapted to guarantee an optimum electrical contact with the flat surface of the finger 6". The specialist will immediately understand that any base for a BGA circuit described especially in relation to FIGS. 5 to 15 may also easily be adapted to house LGA type circuits and that contact plates 46, 47 may be used at the ends of the springs 4, 40.

In the case where the base is used for board-to-board connections between two printed circuit boards, a configuration of the base similar to that of FIG. 17 will be adopted, the fingers 6" being replaced in this case by the connecting paths on the second printed circuit.

FIGS. 18 and 19 illustrate a variant of the invention in which the electrically conductive compressible element inserted in the gap 9 between the pin 3 and the corresponding finger 6 of the integrated circuit 1 is composed of an elastic mat 5. The mat is preferably composed of electrically insulating silicone rubber and preferably has a thickness of 0.3 up to about 1 mm, or even more, these values being given here solely by way of illustration. Metal wires 10, preferably gilt wires, are integrated in the mat. The wires are disposed substantially perpendicular to the plane of the mat, at 0.05 up to 0.1 mm from one another approximately, and all cut flush with the upper surface and with the lower surface of the mat. To reduce the price of the mat, and depending on the size of the fingers 6 and the pins 3, it is possible, if need be, to have wires 10 much more widely spaced in the mat 5. Such mats are marketed by the Japanese company SHIN-ETSU, for example.

The base support 7 is formed of two superimposed plates 33 and 34, between which the compressible mat 5 is disposed. The plates 33 and 34, as well as the mat, are mutually fastened by appropriate means not shown; the mat 5 is sufficiently large to extend over all the openings 13. The pins 3 are inserted in the openings 13 below the mat through the lower plate 33 and can move slightly longitudinally in these openings. The bottom end of the pins 3 is placed in electrical contact with the corresponding paths 8 via a coil spring 40, as for the variant illustrated in FIG. 5. Stop means may be provided to keep the pin 3 from coming out at the lower end of the openings 13.

The top end of the pins 3 placed in contact with the mat 5 is designed to be placed in contact with the largest possible number of metal wires 10 in the mat, and so as to be able to penetrate slightly into the elastic mass of the mat. In FIG. 19, the end of the pin 3 is for this purpose provided with several teeth 12 disposed in a ring. Other configurations are also possible, for example one concave end of the pins 3 having a circular surface of contact with the mat 5.

The fingers 6 of the integrated circuit 1 are inserted in the openings 13 contrived in the upper plate 34, the side surfaces of these openings permitting the integrated circuit to be guided and centered above the base. The upper plate 34 having no other functions than this centering, it may be thinner than the lower plate 33. For LGA type circuits, centering through the openings 13 is not possible; in this case, other centering means must be provided, and the upper plate 34 can then be completely dispensed with. If need be, it may also be dispensed with for the BGA, CGA, or flip-chip circuits. An electrical contact between each contact finger 6 and the corresponding pin 3 is established when the circuit 1 is pressed against the base thanks to the pressing means already mentioned. At least one wire, but preferably a multitude of wires, then establish a reliable electrical contact through the compressed mat 5.

Even if, because of repeated use, for example, the mat 5 does not have the same thickness in all the openings 13, the pin 3 is not firmly fixed within the openings. In this way, a certain clearance permits compensating for possible irregularities and thus ensuring sufficient pressure in each opening 13 between the pin 3 and the mat 5.

In order not to burden the description, the use of a mat 5 as a compressible element replacing the coil spring 4 has been illustrated and described here only in a configuration corresponding to that of FIG. 7; the specialist will understand, however, that it is also possible to use similar mats to replace any spring 4 or 40 in any of the configurations described in relation to FIGS. 5 to 15 or 29 to 31. In particular, it is likewise perfectly possible to replace the coil springs 4 and 40 in the variants of FIGS. 11 to 14 by a compressible mat, while keeping a coil spring 3' as pin between the two mats. For this purpose it may be preferable to modify the two ends of the coil spring 3', or to provide an adapter part at each end, to guarantee an excellent contact with the wires 10 within the mat.

FIG. 20 illustrates a variant of the pressing means of the electric component 1 against the pins 6 [sic] of the base. In this variant, the pressing means are composed of a spring 17 of approximately polygonal shape, for example rectangular or square. In the free state, the spring 17 is composed of eight strips inclined at about 45ø to the horizontal, the inclination of two successive strips being opposite each time. When the spring is fixed, the upper corners of the spring are each blocked under the head of a fixing screw 23. The integrated circuit 1 is compressed against the base 7 at four locations by the pressing points 28. By driving or unscrewing the screws 23 more or less, the pressure exerted by the spring 17 may be adjusted.

It is obvious that other forms of screw may be chosen. It is likewise possible to dispose the spring differently, for example so that it does not rest directly on the integrated circuit 1 but only via an additional part or, if need be, a cooling radiator.

Another variant of the pressing means is illustrated in FIG. 21. Four pressing elements 18, only one of which is shown here, are provided as in the variant of FIG. 1. The fixing screws 23 permit pressure to be exerted on the upper face of the integrated circuit 1 via a holding plate 29. The intensity of the pressure may be adjusted by driving or unscrewing the screws 23 more or less. Additional regulating screws 19 fitted in threaded holes through the holding plate 29 permit the pressure to be adjusted against the back of the circuit 1 at multiple locations. The adjusting springs 19 might also be disposed with and only the fixing screws 23 used for regulating the pressure.

A single holding plate or frame may be provided instead of individual holding elements. In FIG. 22, a frame 35 serves as a holding element, exerting pressure on the upper face of the integrated circuit 1. This frame may be of metal or preferably of synthetic material. Another frame 36 above the support 7 permits the integrated circuit 1 to be guided laterally and perfectly centered above the base. The centering frame 36 is squeezed and held between the support 7 and the integrated circuit 1. Holes 37 are provided in the centering frame and aligned coaxially with corresponding holes 38 in the holding frame 35. Fixing screws 39 pass through these holes 37 and 38 and are fitted in a thread provided in the support 7. The frames 35 and 36 permit centering of the integrated circuit 1 to be facilitated, on the one hand, and avoiding pressure or possible deformation of the integrated circuit 1 when the fixing screws are tightened too much, on the other hand.

It is likewise possible to use a holding plate rather than a frame 35. In this case, it is possible to fasten a radiator on the upper face of the holding plate, or to configure the plate itself as a radiator element.

Another possibility of holding and pressing the integrated circuit 1 above the base is illustrated in FIGS. 23 and 24. A pressing washer 67 is placed directly on the integrated circuit. This washer is, for example, of metal and has good thermal conductivity. An additional plate 63 is juxtaposed over the pressing washer 67 and held above the base thanks to four columns 64 passing through openings 66 in the additional plate. The columns 64 are integrally joined to the base support 7 or to the printed circuit board 2. The shape of the column heads 65 and that of the openings 66 permits the additional plate 63 to be removed by first turning it slightly in the direction of arrow c until the heads 65 are opposite widenings provided in the openings 66, then lifting it. Assembly of the integrated circuit 1 takes place in reverse by successively placing the integrated circuit 1 above the base, then the pressing washer 67 on the upper face of the circuit 1, then slipping the additional plate 63 over the column heads and pivoting it in the opposite direction from arrow c. A centering frame of synthetic material, not shown, may be provided about the integrated circuit 1 to facilitate its positioning.

A cooling radiator 60 comprising several blades 61 is then screwed through an opening 62 in the center of the additional plate 63. When screwed in, it comes to rest against the pressing washer 67, which in turn exerts pressure on the upper face of the integrated circuit 1, holding the latter firmly pressed above the pins 3.

Another possibility of holding and pressing the integrated circuit 1 above the base is illustrated in FIGS. 25 and 26. The base 7 is provided with four columns 57, each column ending in a widened head 58. The integrated circuit 1 correctly oriented between these four columns is held by a spring 59 wedged between the integrated circuit 1 and the four heads 58 of columns 57. The spring 59 is preferably not plane but undulating so as effectively to compress the possible differences in height or thickness of the base 7, the integrated circuit 1, or the columns 57.

FIGS. 27 and 28 illustrate still another possibility of holding and pressing the integrated circuit 1 above the base. A holding ring 70 cooperates with an intermediate part 71 to lock the integrated circuit 1 and press it against the base support 7. The intermediate part 71 is inserted under the integrated circuit 1 and held integral with the base by means not shown; it comprises a projecting course 72 at four points. The intermediate part 71 is produced by injection; in a variant, it may also be integrated into the base support 7. The holding ring 70 may be slipped on over the circuit 1 and the intermediate part 71; by pivoting it slightly in the direction of arrow d, an inclined support surface 73 of the ring 70 comes to rest against each projecting course 72. By pivoting the ring further, the resting pressure first increases with the level of the surface 73, then slackens with a click when the projecting course 72 has passed over the upper point of the inclined support surface 73. This type of holding by a ring or by self-locking small gag is known by the name of "cam lock."

The holding ring 70 has a large central opening 74 permitting the upper surface of the electric component 1 to be seen and, if necessary, a radiator or cooling element to be attached there. Other configurations of the holding ring may easily be imagined in order to facilitate the attachment of a radiator, for example, the self-locking holding ring may be replaced by four self-locking holding pivots permitting the integrated circuit to be attached to the base at four locations while leaving the largest possible part of the upper surface of the integrated circuit accessible.

In the examples given above, stop type means 44, 45 and projections 42, 43 are provided for retaining the pins within the openings 13 and thus preventing them from being able to come out when the base is turned over or shaken, for example. These means make the manufacture and assembly of the base more complicated and can, moreover, necessitate a greater thickness of the base. It may be possible to retain the pins 3 or 3' thanks only to the friction against the sidewalls of the openings 13; however, it is difficult to find a compromise between sufficient holding and a necessary mobility of the pins. FIG. 29 illustrates a variant of the invention operating without stops. The base support 7 is formed in this example by two superimposed plates 52 and 53, between which are disposed two thinner plates 50 and 51. The plates 52 and 53 are mutually attached by appropriate means, for example by clips or by screws or rivets not passing through the intermediate plates 50 and 51. Through openings 13 are contrived through the four plates 50 to 53 at the locations corresponding to the fingers of the integrated circuit. A pin 3 is inserted in each opening. The electrical contact between each pin 3 and the corresponding path 8, or with the corresponding finger of the integrated circuit, respectively, is ensured via electrically conductive compressible elements, in this example via coil springs 4 and 40.

The intermediate plates 50, 51 can move in their own plane as indicated by arrows a and b. Means not shown are preferably provided for permitting the user to move them easily; for example, the plates 50 and 51 can prove to be wider along at least one direction than the plates 52 and 53, thus permitting an operator to push them. For example, by pushing the plate 50 in the direction indicated by arrow a and plate 51 in the direction indicated by arrow b, it is thus managed to get a vice-grip on and wedge all the pins 3 in their respective openings 13 simultaneously. The plates 50 and 51 may preferably be locked by means of pins 90 (FIG. 15) in a position permitting loose holding of the pins in the holes and allowing a minimum of freedom of movement.

By once more moving the plates 50 and 51 so as to align the holes 13 perfectly on the four plates, it is possible to release the pins 3 and to extract them or to replace some of them, if necessary.

FIG. 30 illustrates another variant of the invention in which the principle of gripping and holding plates 50, 51 is used with pins 3' of the coil spring type. For simplification of the figure, the pin 3' and the electrically conductive compressible elements 4 and 40 are composed of a single coil spring of constant diameter all along its length. It is obvious, however, that the holding principle applies just as well if, as in the variants illustrated in FIGS. 5 to 14, the pin 3' is composed of a spring which is different and possibly of a different diameter from the compressible elements 4 and 40. According to the position of the plates 50 and 51, it is possible either to hold the spring firmly in the opening 13, a certain longitudinal movement being allowed by the deformability of the spring, however, or to release the spring 3' completely in order to be able possibly to replace it.

It is naturally also possible to use a number of sliding holding plates other than two, for example to use only a single sliding plate relative to a fixed plate.

FIG. 31 illustrates a variant of the invention in which the pins 3 are held in the support 7 by means of stops 44, 45 cooperating with projections 42, 43, respectively. The support 7 is formed of two plates 52, 53 capable of sliding in relation to one another. Depending on the mutual positions given to the plates 52 and 53, the stops 44 and 45 can be moved closer or apart and therefore either hold the pins 3 axially or widen the openings 13 so that the plates 52 and 53 may be lifted and removed over the pins 3. The lower plate 53 is not in contact with the printed circuit 2, on the contrary it is held pressed by the projections 43 of the pins 3 against the upper plate 52 by leaving a space between the support 7 and the printed circuit 2. The pins 3 are, for example, soldered to the paths 8 by injecting hot air through this space.

In FIG. 31, the pins 3 are soldered to the paths 8 of the printed circuit; by removing the plates 52 and 53 after soldering, it is possible to check and, if need be, to repair the soldered joints 58 very easily. A stop is provided for retaining the solder and for keeping it from rising by capillary action into the opening 13.

In a variant not illustrated, the pins 3 might simply be pressed against the paths 8 of the printed circuit, without soldering. In this case, the base 7 is held against the printed circuit 2, for example, by means of screws passing through these two elements and permitting sufficient pressure to be exerted between the pins 3 and the paths 8 to guarantee a quality electrical contact.

It is naturally also possible to provide bases 7 formed of any desired number of sliding plates capable of being removed for checking the soldering. Moreover, the specialist will understand that this type of movable pins locked by soldering or pressure at the time of mounting the base on the printed circuit board may also be used with the other base variants discussed.

FIG. 32 illustrates a through stud-bolt 54 permitting a base 7 to be attached and centered on the printed circuit 2. Such an attachment is necessary when the pins 3 or the compressible elements 40 are not soldered to the paths 8 of the printed circuit 2; even when the pins are intended to be soldered on the printed circuit, stud-bolts permit the positioning and centering to be facilitated prior to soldering. The stud-bolt 54 is formed of plastic or metal and passes through the printed circuit 2, as well as, in this example, all the layers of the base 7. It is inserted by forcing and held by a threaded counter-element 55 screwed inside the stud-bolt.

In the case of particularly complex printed circuit boards, including, for example, a multitude of layers of paths, it may be difficult to provide openings through the board for the passage of the stud-bolts 54. In this case, stud-bolts attached by soldering directly to the printed circuit board may also be used, as illustrated in FIG. 33. In this figure, a stud-bolt 56 attached to the printed circuit 2 by soldered joints 57 holds solely the upper layers 52 of the printed circuit; the other layers 50, 51, and 53 can slide in relation to this fixed layer 52, as explained above. A threaded counter-element 55 screwed inside the stud-bolt 56 permits it to be held once inserted. The four layers 50 to 53 may be mutually fixed by a pin 90 (FIG. 15) in a position allowing a slight movement of the pins 3.

To prevent any pivoting of the base in relation to the printed circuit 2, at least two, but preferably four stud-bolts 54 or 56 will be used. Preferably, these stud-bolts will be disposed at the four corners of the base rather than on its sides. In this way, a maximum of possibilities are maintained for placing paths 8 under the printed circuit for reaching its inputs-outputs.

FIG. 34 illustrates a detail of contact plate 46 attachable to the end of the spring 4 opposite the pin 3. The contact plate 46 is held at the end of the spring 4 in this example by an extension 461 of smaller diameter inserted between the turns of the spring 4 and widening into a collar 462 permitting the plate 46 to be retained within the spring. The collar 462 further permits improving the electrical contact between the spring 4 and the plate 46. The plate may also be joined to the spring by any known means, the solution illustrated offering the advantage, however, of detachable plates and of economical assembly without soldering.

The lateral sides of the contact plate 46 are vertical or, preferably, as illustrated in this figure, provided with a concave groove 463. This groove permits the soldering of the plate to be facilitated when the latter is soldered rather than simply pressed against the corresponding connection element. In this case, possible surpluses of soldering flux are captured by the groove and are thus not liable to flow to spring 4. The groove 463 or the concave portion of the sides of the plate may have any cross-section, for example trapezoidal or rounded.

FIG. 35 illustrates a variant of means for retaining the contact plates 46. In this case, the plates 46 are simply placed on the surface of the spring 4, the end of the plate close to the spring having a shape adapted to ensure an optimum electrical contact with the spring. A hole frame 81 is placed over the base support 7, the holes 84 through the frame 81 being superimposed over the openings 13 in the base support 7. The diameter of the holes 84 is, however, slightly less than the diameter of the openings 13, so as to define a stop 86 capable of retaining the contact plate 46 by a projection 464. The plate 46 is therefore retained in the same way as the socket 83 in FIG. 16. The hole frame 81 may be attached, for example, by gluing or screwing to the support 7, after insertion of the plates 46.

The contact surface 460 at the end of the plate is, in the examples of FIGS. 34 and 35, convexly domed and adapted in particular to Land Grid Array type circuits. This configuration permits an optimum contact to be ensured with the plane connection disks of the LGA circuit, even when the axis of the contact plate 46 is not perfectly perpendicular to the surface of the disks 6. However, the surface 460 may also be much more pointed so as to have an electrical contact only at a single point, perfectly plane or concavely domed depending upon the type of electric component it is desired to connect on the base. The contact disks 46 are made of an electrically conductive material, preferably of brass, possibly of copper, steel, or precious metal. One advantage of the invention is to be able to use, if necessary, plates 46 of a material different from the material used for the spring 4 and from the material used for the pin 3. Thus, it is possible to optimize the choice of materials for each element according to the constraints to which it is subject. For example, it is possible to manufacture plates 46 of gold in order to improve the contact and reduce the problems of oxidation, and to choose another more economical material for the spring and the pin 3. In this way, the quantity of gold used may be minimized.

Moreover, it is possible to manufacture almost complete standard bases and to adapt them to various types of integrated circuits or to quality requirements simply by providing them with different types of detachable contact plates.

The examples above relate particularly to contact plates 46 used to facilitate the contact between the pin 3 and connection elements 6 of the LGA integrated-circuit finger type. Upper plates 46 or lower plates 47 may, however, be used to facilitate the connection with BGA or CGA type fingers, for example, or even to facilitate the contact with printed circuit paths or with a multiconductor cable. In case of connection of an integrated circuit on a printed circuit, it is thus possible to use contact plates either on the integrated circuit side or on the printed circuit side or on both sides simultaneously. The contact plates 46, 47 may be used either simply pressed against or soldered to the corresponding connection element (path or finger). Contact plates 46, 47 may be used either with fixed-pin bases or with movable-pin bases.

We have described above different variants, especially for the nature of the pins (rods 3 or springs 3'), the position of the compressible elements 4, 5, or 40, their nature (coil spring 4, 40 or mat 5), the position of the contact plates 46 and 47, the longitudinal holding of the pins within the openings (stops 44, 45 or sliding plates 50, 51), the means of pressing the integrated circuit 1 against the base, the type of circuit (BGA, LGA, CGA, flip-chip, board-to-board, for example), etc. Although a complete enumeration of all the possible combinations of these different variants would prove tedious, the specialist will be able to combine and adapt these diverse variants without difficulty.

What is claimed is:

1. A connection base permitting a second electric component to be detachably attached to a first electric component and electrically connecting the two electric components, each electric component comprising a plurality of connection elements, the connection base comprising:

a support held between the first electric component and the second electric component comprising a plurality of through openings disposed in the same way as said connection elements;

a plurality of conductive pins, wherein one end of each pin is in electrical contact with a connection element of the first electric component and the other end is in electrical contact with a connection element of the second electric component, one of said pins being disposed in each of said through openings, said pins being longitudinally and loosely held within said through openings, each of said pins defining a space in said through openings at an end of each of said pins so that said pins are set back in relation to at least one end of said openings; and an electrically conductive, longitudinally compressible element housed in at least one of said spaces to establish an electrical contact between each pin and the corresponding connection element of the first electric component and/or the corresponding connection element of the second electric component detachably mounted, the length of said compressible element being such that it does not protrude beyond the openings of the support when said electric components are mounted.

2. The base according to claim 1, wherein each of said pins is composed of an elongated element in rod form and in one piece.

3. The base according to claim 1, wherein each of said pins includes a coil spring.

4. The base according to claim 1, wherein at least one of the electrically conductive compressible elements includes a coil spring.

5. The base according to claim 1, wherein each of said pins includes a coil spring, and at least one of the electrically conductive compressible elements includes a coil spring of a different diameter.

6. The base according to claim 1, wherein said pins and said electrically conductive compressible elements includes a single spring.

7. The base according to claim 4, wherein said at least one of said electrically conductive compressible elements includes a coil spring, and an end of said coil spring opposite said pin includes a contact plate.

8. The base according to claim 4, wherein said at least one of said electrically conductive compressible elements includes a coil spring, and an end of said coil spring opposite said pin includes a contact plate.

9. The base according to claim 1, wherein at least one of said electrically conductive compressible elements comprises an electrically insulating elastic mat in which fine electrically conductive wires are incorporated therein.

10. The base according to claim 9, wherein said mat extends over the entirety of the support surface traversed by said pins.

11. The base according to claim 9, wherein an end of said pins oriented toward said elastic mat has a cavity with a round rim or a notched ring with several teeth.

12. The base according to claim 1, wherein a longitudinal movement of said pins within said through openings is limited by stops within said through openings.

13. The base according to claim 1, wherein a longitudinal movement of said pins within said through openings is limited by friction of the pins against the sidewalls of said openings.

14. The base according to claim 13, wherein said support traversed by said through openings is composed of several superimposed plates, at least one of which can slide in relation to the others so as to be able to adjust said friction of the pins against the sidewalls of said through openings.

15. The base according to claim 14, wherein said pins are soldered against said first electric component, and in that it is possible to remove said support by sliding said superimposed plates to expose the soldered joints joining said pins to said first electric component.

16. The base according to claim 1, further comprising means for pressing said second electric component against said pins, said means for pressing being integral with the base and comprising one or more screws permitting pressure to be exerted against the upper face of the second electric component.

17. The base according to claim 1, further comprising means for pressing said second electric component against said pins, said means for pressing being integral with the base and comprising a spring type element permitting pressure to be exerted against the upper face of the second electric component.

18. The base according to claim 1, further comprising means for pressing said second electric component against said pins, said means for pressing being integral with the base and comprising at least one rigid holding plate permitting pressure to be exerted against the upper face of the second electric component.

19. The base according to claim 1, further comprising means for pressing said second electric component against said pins, said means for pressing being of the self-locking type.

20. The base according to claim 1, further comprising means for pressing said second electric component against said pins, said means for pressing being integral with the base or with the first electric component, the support pressure being adjustable.

21. The base according to claim 2, wherein an end of said through openings opposite the second electric component is formed to permit the guidance of the corresponding connection element of said second electric component.

22. The base according to claim 7, wherein a contact surface of said contact plate is convex.

23. The base according to claim 22, wherein said contact plate is pointed, and said contact surface is reduced to one point.

24. The base according to claim 7, wherein a contact surface of said contact plates is a plane.

25. The base according to claim 7, wherein lateral sides of said contact plate comprise a concave portion.

26. The base according to claim 7, wherein said electrically conductive compressible elements are composed of a coil spring, and said contact plate is held on the ends of said compressible elements by a portion inserted between turns of the spring.

27. The base according to claim 26, wherein said portions inserted between the turns of the spring comprise a collar wider than the rest of said portion.

28. The base according to claim 7, wherein a contact surface of said contact plates is convex, and at least one portion of each connection element is insertable in said convex portion of said contact plates.

29. The base according to claim 7, wherein said contact plate is removable.

30. The base according to claim 7, wherein said contact plate is made of a different material than said compressible elements and/or than said pins.

31. The base according to claim 7, wherein said contact plate is held by means of a socket frame placed on said support and provided with through openings disposed in the same way as said connection elements, a contact plate being inserted in each through opening and placed in electrical contact with said pins.

32. The base according to claim 1, wherein said second electric component is composed of a Ball Grid Array (BGA) or flip-chip type integrated circuit.

33. The base according to claim 1, wherein said second electric component is composed of a Land Grid Array (LGA) type integrated circuit.

34. The base according to claim 1, wherein said second electric component is composed of a Column Grid Array (CGA) type integrated circuit.

35. The base according to claim 34, further comprising a socket frame placed on said support and provided with through openings disposed in the same way as said connection elements, a metal socket inserted in each through opening and placed in electrical contact with said pins, wherein one connection element is inserted in each of said sockets.

36. The base according to claim 1, wherein said electric components are each composed of a printed circuit board, said base permitting a board-to-board connection to be effected between the paths of the two printed circuits.

37. The base according to claim 1, further comprising means for pressing said second electric component against said pins, said means for pressing comprising a radiator screwed above said second electric component on a part integral with the base or with the first electric component and permitting pressure to be exerted against the upper face of the second electric component.

38. The base according to claim 8, wherein said contact plate is removable.

39. The base according to claim 8, wherein said contact plate is made of a different material than said compressible elements and said pins.

40. The base according to claim 8, wherein said contact plate is held by means of a socket frame placed on said support and provided with through openings disposed in the same way as said connection elements, a contact plate being inserted in each through opening and placed in electrical contact with said pins.

* * * * *